(12) United States Patent
Raja et al.

(10) Patent No.: US 10,929,591 B2
(45) Date of Patent: Feb. 23, 2021

(54) TECHNIQUES FOR PRE-SILICON TESTING INTEGRATED CIRCUIT DESIGNS THAT ACCOMMODATE POWER-SUPPLY NOISE AND ADAPTIVE-CLOCK AWARE TIMING

(71) Applicant: NVIDIA CORPORATION, Santa Clara, CA (US)

(72) Inventors: Tezaswi Raja, San Jose, CA (US); Prashant Singh, San Jose, CA (US); Vinayak Bhargav Srinath, San Jose, CA (US); Wen Yueh, Sunnyvale, CA (US)

(73) Assignee: NVIDIA Corporation, Santa Clara, CA (US)

( * ) Notice: Subject to any disclaimer, the term of this patent is extended or adjusted under 35 U.S.C. 154(b) by 0 days.

(21) Appl. No.: 16/516,098

(22) Filed: Jul. 18, 2019

(65) Prior Publication Data
US 2021/0019377 A1 Jan. 21, 2021

(51) Int. Cl.
*G06F 30/398* (2020.01)
*G06F 30/33* (2020.01)

(52) U.S. Cl.
CPC ............ *G06F 30/398* (2020.01); *G06F 30/33* (2020.01)

(58) Field of Classification Search
CPC ................................ G06F 30/398; G06F 30/33
See application file for complete search history.

(56) References Cited

U.S. PATENT DOCUMENTS

| | | | | |
|---|---|---|---|---|
| 2009/0063111 A1* | 3/2009 | Hollis | ...................... | G06G 7/26 703/5 |
| 2009/0228851 A1* | 9/2009 | Abbaspour | ........... | G06F 30/367 716/113 |
| 2020/0089828 A1* | 3/2020 | Suess | .................... | G06F 30/327 |

OTHER PUBLICATIONS

Wang et al., "A vector-based approach for power supply noise analysis in test compaction," 10 pages, IEEE, Dec. 2005.*
Pant et al., "Vectorless Analysis of Supply Noise Induced Delay Varitatoin," ICCAD '03, Nov. 11-13, 2003, pp. 184-191.*

* cited by examiner

*Primary Examiner* — Vuthe Siek
(74) *Attorney, Agent, or Firm* — Artegis Law Group, LLP

(57) ABSTRACT

Various embodiments of the disclosure disclosed herein provide techniques for pre-silicon testing of a design for an integrated circuit. A pre-silicon testing system identifies one or more critical paths included in the integrated circuit. The pre-silicon testing system performs a based noise simulation to generate one or more voltage waveforms at each gate associated with the one or more critical paths. The pre-silicon testing system applies the one or more voltage waveforms to one or more netlists corresponding to the one or more critical paths to generate one or more modified netlists. The pre-silicon testing system performs a timing analysis on the one or more modified netlists to determine a set of slack times that correspond to a set of voltages applied to the integrated circuit. The pre-silicon testing system determines a first critical path that has a lowest slack time relative to all other critical paths.

20 Claims, 10 Drawing Sheets

TECHNIQUES FOR PRE-SILICON TESTING INTEGRATED CIRCUIT DESIGNS THAT ACCOMMODATE POWER-SUPPLY NOISE AND ADAPTIVE-CLOCK AWARE TIMING

BACKGROUND

Field of the Embodiments

Various embodiments of the present disclosure relate generally to integrated circuit design and, more specifically, to techniques for pre-silicon testing integrated circuit designs that accommodate power-supply noise and adaptive-clock aware timing.

Description of the Related Art

Prior to releasing an integrated circuit (IC) design for fabrication and packaging, various analyses are performed on the design to ensure that the fabricated integrated circuit will work properly at the desired speed. In particular, timing analyses are performed in order to evaluate the impact of power supply noise on critical data path and clock path timing.

One commonly-used timing analysis is known as "voltage drop aware static timing analysis" (or "IR STA"). This type of timing analysis is performed in two parts. First, the worst case voltage (IR) drop is estimated between the power supply and the nodes on the integrated circuit design. Voltage drop is caused by the resistance of the material employed in the power grid and current drawn by various functional circuit elements of the integrated circuit during operation. Once the worst case IR drop is determined, IR STA is then performed to determine the timing impact of the worst case IR drop on the overall performance of the integrated circuit design. As is well-known, static timing analysis determines the path delay on all circuit paths within the integrated circuit design based on the worst case IR drop. In general, path delay has an inverse relationship with the operating frequency of the integrated circuit. Therefore, by calculating the path delay on all circuit paths, IR STA determines the maximum operating frequency of the integrated circuit.

Notably, however, IR STA suffers from several shortcomings. First, because IR STA performs IR drop analysis and static timing analysis as separate processes, IR STA necessarily assumes that the worst case voltage drop is simultaneously present at all nodes in the integrated circuit when performing static timing analysis. In reality, different gates typically experience different noise levels, and not all gates experience the highest noise levels in the same clock cycle. Second, IR STA assumes a fixed-frequency clock source and does not model a noise-adaptive clock generator, where the frequency of the clock changes as the power supply voltage changes. Third, IR STA models noise only in the supply voltage and does not separately model ground bounce effects. Fourth, IR STA does not consider the impact of different transient noise levels on the rising versus falling transitions of a voltage waveform of an electronic signal within the integrated circuit. These shortcomings result in pessimistic design assumptions that can result in integrated circuit designs having excessive margins and being overdesigned.

More specifically, pessimistic assumptions involving timing analysis can cause designers to change the designs of certain circuit paths to increase the speeds of those circuit paths. However, increasing the speeds of those circuit paths does not necessarily improve overall design performance. Accordingly, these types of design changes can result in increased power consumption without a corresponding increase in overall design performance. Pessimistic assumptions involving IR drop can cause designers to increase the size of the integrated circuit power grid unnecessarily in order to reduce resistance and, in turn, reduce IR drop. A larger power grid consumes additional integrated circuit metal area, leaving less metal area for signal routing, which makes the integrated circuit design process more difficult. Alternatively, the die size can be increased to accommodate the larger power grid, but doing so increases the overall cost of the integrated circuit.

As the foregoing illustrates, what is needed in the art are more effective ways to perform pre-silicon testing of the performance of integrated circuit designs.

SUMMARY

Various embodiments of the present application set forth a computer-implemented method for performing pre-silicon testing of a design for an integrated circuit. The method includes identifying, based on a static timing analysis, one or more critical paths included in the integrated circuit. The method further includes performing a noise simulation to generate one or more voltage waveforms at each gate associated with the one or more critical paths. The method further includes applying the one or more voltage waveforms to one or more netlists corresponding to the one or more critical paths to generate one or more modified netlists. The method further includes performing a timing analysis on the one or more modified netlists to determine a set of slack times that correspond to a set of voltages applied to the integrated circuit. The method further includes determining, based on the set of slack times, a first critical path included in the one or more critical paths that has a lowest slack time relative to all other critical paths included in the one or more critical paths.

Other embodiments of the present application include, without limitation, a computer-readable medium including instructions for performing one or more aspects of the disclosed techniques, as well as a computing device for performing one or more aspects of the disclosed techniques.

At least one technical advantage of the disclosed techniques relative to the prior art is that the disclosed techniques enable the temporal, spatial, and adaptive clock effects of integrated circuit designs to be more effectively modeled and analyzed. Accordingly, the more important critical paths within an integrated circuit design can be identified based on a more accurate model of how the integrated circuit behaves in actual operation. As a result, design efforts can more properly focus on the critical paths that actually limit the maximum operating frequency of the integrated circuit and avoid focusing on critical paths that do not substantially impact maximum operating frequency. By implementing the disclosed techniques, among other things, power consumption and die area of the final integrated circuit can be reduced. These technical advantages represent one or more technological improvements over prior art approaches.

BRIEF DESCRIPTION OF THE DRAWINGS

So that the manner in which the above recited features of the present disclosure can be understood in detail, a more particular description of the one or more embodiments, briefly summarized above, may be had by reference to certain embodiments, some of which are illustrated in the appended drawings. It is to be noted, however, that the appended drawings illustrate only typical embodiments and are therefore not to be considered limiting of its scope, for the disclosure may admit to other equally effective embodiments.

DETAILED DESCRIPTION

In the following description, numerous specific details are set forth to provide a more thorough understanding of the present disclosure. However, it will be apparent to one of skill in the art that the present disclosure may be practiced without one or more of these specific details.

System Overview

Figure 1:
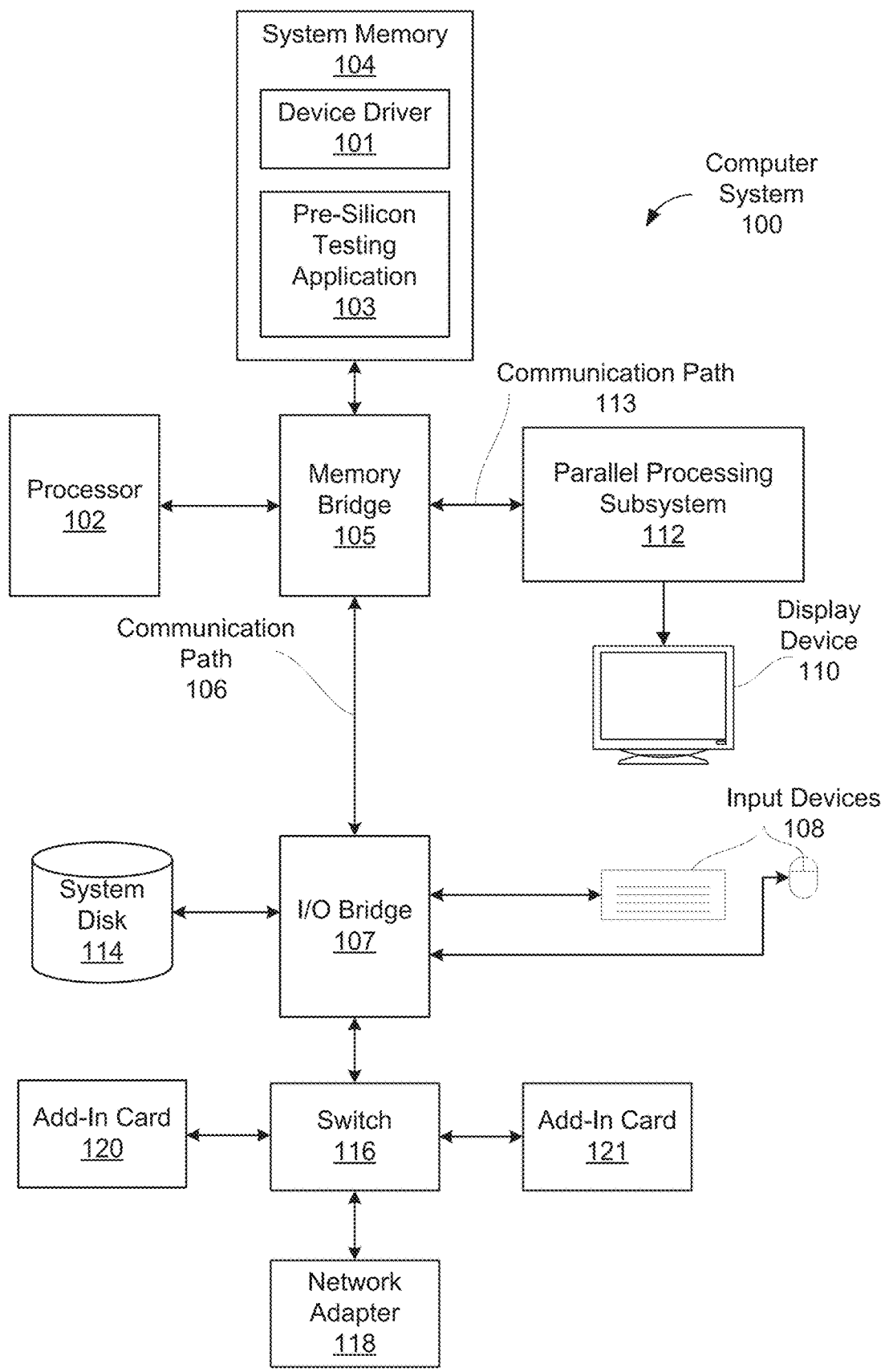
FIG. 1 is a block diagram illustrating a computer system configured to implement one or more aspects of the various embodiments.

FIG. 1 is a block diagram illustrating a computer system 100 configured to implement one or more aspects of the various embodiments. As shown, computer system 100 includes, without limitation, a processor 102 and a system memory 104 coupled to a parallel processing subsystem 112 via a memory bridge 105 and a communication path 113. Memory bridge 105 is further coupled to an I/O (input/output) bridge 107 via a communication path 106, and I/O bridge 107 is, in turn, coupled to a switch 116.

In general, processor 102 may retrieve and execute programming instructions stored in system memory 104. Processor 102 may be any technically feasible form of processing device configured to process data and execute program code. Processor 102 could be, for example, a central processing unit (CPU), a graphics processing unit (GPU), an application-specific integrated circuit (ASIC), a field-programmable gate array (FPGA), and so forth. Processor 102 stores and retrieves application data residing in the system memory 104. Processor 102 is included to be representative of a single CPU, multiple CPUs, a single CPU having multiple processing cores, and the like. In operation, processor 102 is the master processor of the mobile device 404, controlling and coordinating operations of other system components. System memory 104 stores software application programs and data for use by processor 102. Processor 102 executes software application programs stored within system memory 104 and optionally an operating system. In particular, processor 102 executes software and then performs one or more of the functions and operations set forth in the present application.

In operation, I/O bridge 107 is configured to receive user input information from input devices 108, such as a keyboard or a mouse, and forward the input information to processor 102 for processing via communication path 106 and memory bridge 105. Switch 116 is configured to provide connections between I/O bridge 107 and other components of the computer system 100, such as a network adapter 118 and various add-in cards 120 and 121.

As also shown, I/O bridge 107 is coupled to a system disk 114 that may be configured to store content and applications and data for use by processor 102 and parallel processing subsystem 112. As a general matter, system disk 114 provides non-volatile storage for applications and data and may include fixed or removable hard disk drives, flash memory devices, and CD-ROM (compact disc read-only-memory), DVD-ROM (digital versatile disc-ROM), Blu-ray, HD-DVD (high definition DVD), or other magnetic, optical, or solid state storage devices. Finally, although not explicitly shown, other components, such as universal serial bus or other port connections, compact disc drives, digital versatile disc drives, film recording devices, and the like, may be connected to I/O bridge 107 as well.

In various embodiments, memory bridge 105 may be a Northbridge chip, and I/O bridge 107 may be a Southbridge chip. In addition, communication paths 106 and 113, as well as other communication paths within computer system 100, may be implemented using any technically suitable protocols, including, without limitation, AGP (Accelerated Graphics Port), HyperTransport, or any other bus or point-to-point communication protocol known in the art.

In some embodiments, parallel processing subsystem 112 is part of a graphics subsystem that delivers pixels to a display device 110 that may be any conventional cathode ray tube, liquid crystal display, light-emitting diode display, or the like. In such embodiments, the parallel processing subsystem 112 incorporates circuitry optimized for graphics and video processing, including, for example, video output circuitry. As described in greater detail below in FIG. 2, such circuitry may be incorporated across one or more parallel processing units (PPUs) included within parallel processing subsystem 112. In other embodiments, the parallel processing subsystem 112 incorporates circuitry optimized for general purpose and/or compute processing. Again, such circuitry may be incorporated across one or more PPUs included within parallel processing subsystem 112 that are configured to perform such general purpose and/or compute operations. In yet other embodiments, the one or more PPUs included within parallel processing subsystem 112 may be configured to perform graphics processing, general purpose processing, and compute processing operations.

The system memory 104 may include, without limitation, at least one device driver 101 configured to manage the processing operations of the one or more PPUs within parallel processing subsystem 112. The system memory 104 may further include, without limitation, a pre-silicon testing application 103. Processor 102 executes the pre-silicon testing application 103 to perform one or more of the techniques disclosed herein and to store data in and retrieve data from system memory 104.

As further described herein, the pre-silicon testing application 103 performs a voltage simulation followed by voltage aware timing simulation of an integrated circuit design. The pre-silicon testing application 103 performs a static timing analysis of the integrated circuit design to determine the delay through each circuit path in the integrated circuit design. In so doing, the pre-silicon testing application 103 determines a path delay for each circuit path included in the integrated circuit. The pre-silicon testing application 103 determines those circuit paths that have longer path delays relative to other circuit paths included in the integrated circuit. The pre-silicon testing application 103 designates the circuit paths with longer path delays as critical paths.

The pre-silicon testing application 103 then selects the top set of critical paths that are the slowest paths according to the static timing analysis. These critical paths may include the circuit paths that are limiting the maximum operating frequency of the integrated circuit. The pre-silicon testing application 103 applies a voltage waveform to the input of each of these critical paths. The pre-silicon testing application 103 then propagates the input voltage waveform in order to determine the voltage waveform at each gate in each critical path.

In parallel, the pre-silicon testing application 103 extracts the netlists for the top set of critical paths from the integrated circuit design. The pre-silicon testing application 103 extracts critical paths with fixed voltage, based on the static timing analysis. The pre-silicon testing application 103 applies the per-gate voltage waveforms to the fixed voltage netlists for each critical path. The pre-silicon testing application 103 then annotates the fixed voltage netlists with per-gate voltage waveforms. More specifically, the pre-silicon testing application 103 identifies the gates associated with each of the extracted netlists. The pre-silicon testing application 103 determines a voltage at each gate based on one or more voltage waveforms. The voltage waveforms may include a supply voltage waveform, a ground signal waveform, and an input voltage waveform, in any technically feasible combination. The pre-silicon testing application 103 modifies the netlists by annotating the netlists with the voltage at each gate to generate a first annotated netlists.

The pre-silicon testing application 103 performs a path-by-path timing simulation based on the annotated netlists, including temporal and spatial information of the integrated circuit design. In so doing, the pre-silicon testing application 103 selects either a fixed-frequency clock generator or a noise-adaptive clock generator in order to compute timing margins based on the relevant clock source.

If the integrated circuit design includes a fixed-frequency clock generator, then the pre-silicon testing application 103 applies a model of a fixed-frequency clock to the annotated netlists. The clock output of the fixed-frequency clock generator operates at a fixed frequency. The pre-silicon testing application 103 determines the clock cycle duration of the fixed frequency. The pre-silicon testing application 103 determines slack times based on a difference between the clock cycle duration of the fixed frequency and a path delay of the annotated netlists. The slack times determined by the pre-silicon testing application 103 correspond to slack values as the voltage varies over time.

If the integrated circuit design includes a noise-adaptive clock generator, then the pre-silicon testing application 103 applies a model of a noise-adaptive clock to the annotated netlists. The clock output of the noise-adaptive clock generator operates at a frequency that varies with changes in the supply voltage. The pre-silicon testing application 103 determines the clock output frequency based on the value of the supply voltage. The pre-silicon testing application 103 determines the clock cycle duration of the clock output frequency. The pre-silicon testing application 103 determines slack times based on a difference between the clock cycle duration of the clock output frequency and a path delay of the annotated netlists. When the supply voltage changes from a first value to a second value, the pre-silicon testing application 103 determines the new clock output frequency based on the second value of the supply voltage and repeats the process set forth above.

The pre-silicon testing application 103 performs the timing analysis on the annotated netlists to determine a set of slack times that correspond to a set of voltages applied to the integrated circuit. The pre-silicon testing application 103 produces an ordered list of critical paths. In so doing, the pre-silicon testing application 103 determines, based on the set of slack times, the critical path that has the lowest slack time relative to all other critical paths. In this manner, the ordered list identifies the circuit paths most likely to be the limiting performance factors for the integrated circuit.

In various embodiments, parallel processing subsystem 112 may be integrated with one or more other the other elements of FIG. 1 to form a single system. For example, parallel processing subsystem 112 may be integrated with processor 102 and other connection circuitry on a single chip to form a system on chip (SoC).

It will be appreciated that the system shown herein is illustrative and that variations and modifications are possible. The connection topology, including the number and arrangement of bridges, the number of processors 102, and the number of parallel processing subsystems 112, may be modified as desired. For example, in some embodiments, system memory 104 could be connected to processor 102 directly rather than through memory bridge 105, and other devices would communicate with system memory 104 via memory bridge 105 and processor 102. In other alternative topologies, parallel processing subsystem 112 may be connected to I/O bridge 107 or directly to processor 102, rather than to memory bridge 105. In still other embodiments, I/O bridge 107 and memory bridge 105 may be integrated into a single chip instead of existing as one or more discrete devices. Lastly, in certain embodiments, one or more components shown in FIG. 1 may not be present. For example, switch 116 could be eliminated, and network adapter 118 and add-in cards 120, 121 would connect directly to I/O bridge 107.

Figure 2:
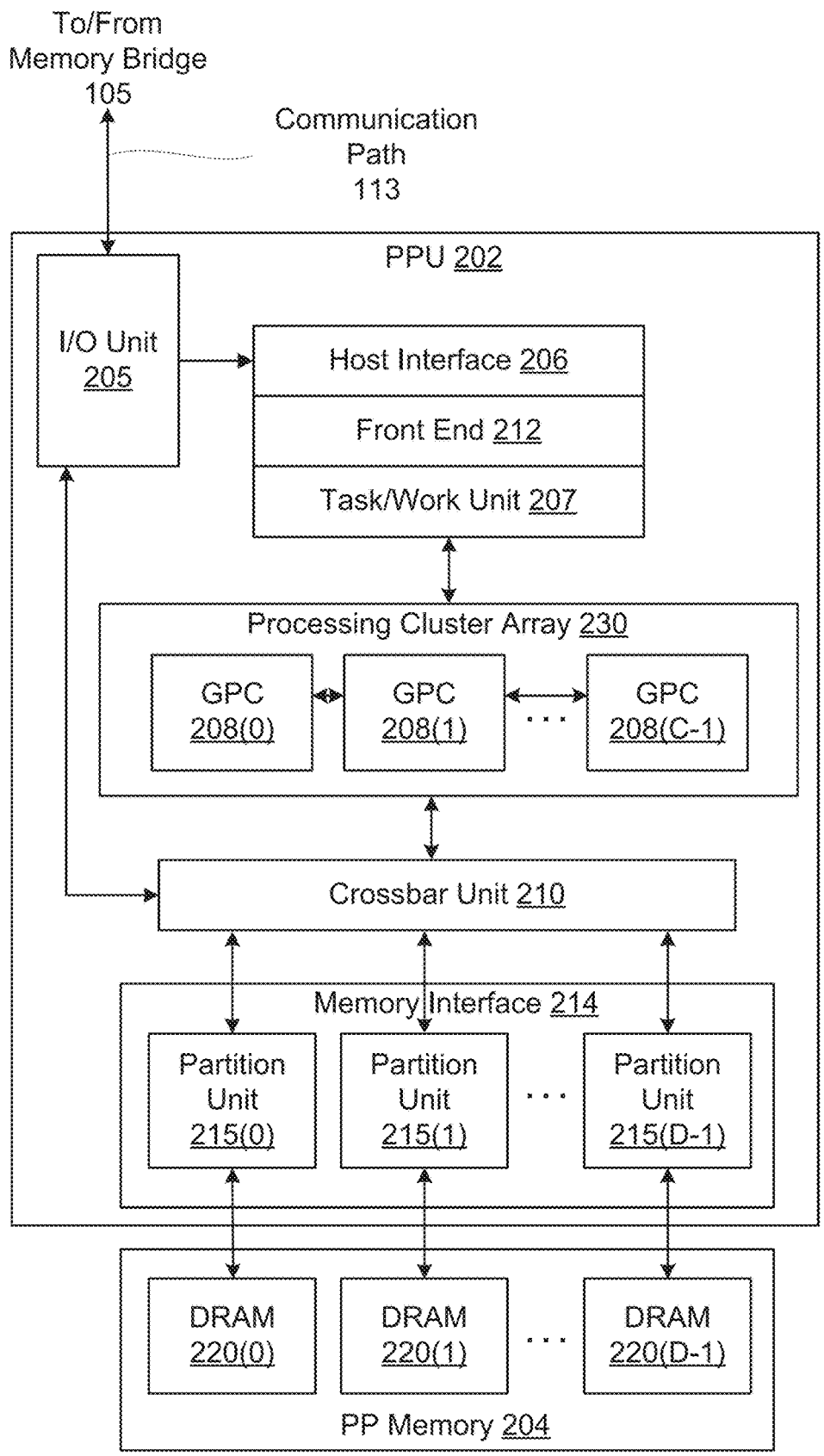
FIG. 2 is a block diagram of a parallel processing unit included in the parallel processing subsystem of FIG. 1, according to various embodiments.

FIG. 2 is a block diagram of a parallel processing unit (PPU) 202 included in the parallel processing subsystem 112 of FIG. 1, according to various embodiments. Although FIG. 2 depicts one PPU 202, as indicated above, parallel processing subsystem 112 may include any number of PPUs 202. As shown, PPU 202 is coupled to a local parallel processing (PP) memory 204. PPU 202 and PP memory 204 may be implemented using one or more integrated circuit devices, such as programmable processors, application specific integrated circuits (ASICs), or memory devices, or in any other technically feasible fashion.

In some embodiments, PPU 202 comprises a graphics processing unit (GPU) that may be configured to implement a graphics rendering pipeline to perform various operations related to generating pixel data based on graphics data supplied by processor 102 and/or system memory 104. When processing graphics data, PP memory 204 can be used as graphics memory that stores one or more conventional frame buffers and, if needed, one or more other render targets as well. Among other things, PP memory 204 may be used to store and update pixel data and deliver final pixel data or display frames to display device 110 for display. In some embodiments, PPU 202 also may be configured for general-purpose processing and compute operations.

In operation, processor 102 is the master processor of computer system 100, controlling and coordinating operations of other system components. In particular, processor 102 issues commands that control the operation of PPU 202. In some embodiments, processor 102 writes a stream of commands for PPU 202 to a data structure (not explicitly shown in either FIG. 1 or FIG. 2) that may be located in system memory 104, PP memory 204, or another storage location accessible to both processor 102 and PPU 202. A pointer to the data structure is written to a pushbuffer to initiate processing of the stream of commands in the data structure. The PPU 202 reads command streams from the pushbuffer and then executes commands asynchronously relative to the operation of processor 102. In embodiments where multiple pushbuffers are generated, execution priorities may be specified for each pushbuffer by an application program via device driver 101 to control scheduling of the different pushbuffers.

As also shown, PPU 202 includes an I/O (input/output) unit 205 that communicates with the rest of computer system 100 via the communication path 113 and memory bridge 105. I/O unit 205 generates packets (or other signals) for transmission on communication path 113 and also receives all incoming packets (or other signals) from communication path 113, directing the incoming packets to appropriate components of PPU 202. For example, commands related to processing tasks may be directed to a host interface 206, while commands related to memory operations (e.g., reading from or writing to PP memory 204) may be directed to a crossbar unit 210. Host interface 206 reads each pushbuffer and transmits the command stream stored in the pushbuffer to a front end 212.

As mentioned above in conjunction with FIG. 1, the connection of PPU 202 to the rest of computer system 100 may be varied. In some embodiments, parallel processing subsystem 112, which includes at least one PPU 202, is implemented as an add-in card that can be inserted into an expansion slot of computer system 100. In other embodiments, PPU 202 can be integrated on a single chip with a bus bridge, such as memory bridge 105 or I/O bridge 107. Again, in still other embodiments, some or all of the elements of PPU 202 may be included along with processor 102 in a single integrated circuit or system of chip (SoC).

In operation, front end 212 transmits processing tasks received from host interface 206 to a work distribution unit (not shown) within task/work unit 207. The work distribution unit receives pointers to processing tasks that are encoded as task metadata (TMD) and stored in memory. The pointers to TMDs are included in a command stream that is stored as a pushbuffer and received by the front end unit 212 from the host interface 206. Processing tasks that may be encoded as TMDs include indices associated with the data to be processed as well as state parameters and commands that define how the data is to be processed. For example, the state parameters and commands could define the program to be executed on the data. The task/work unit 207 receives tasks from the front end 212 and ensures that GPCs 208 are configured to a valid state before the processing task specified by each one of the TMDs is initiated. A priority may be specified for each TMD that is used to schedule the execution of the processing task. Processing tasks also may be received from the processing cluster array 230. Optionally, the TMD may include a parameter that controls whether the TMD is added to the head or the tail of a list of processing tasks (or to a list of pointers to the processing tasks), thereby providing another level of control over execution priority.

PPU 202 advantageously implements a highly parallel processing architecture based on a processing cluster array 230 that includes a set of C general processing clusters (GPCs) 208, where C 1. Each GPC 208 is capable of executing a large number (e.g., hundreds or thousands) of threads concurrently, where each thread is an instance of a program. In various applications, different GPCs 208 may be allocated for processing different types of programs or for performing different types of computations. The allocation of GPCs 208 may vary depending on the workload arising for each type of program or computation.

Memory interface 214 includes a set of D of partition units 215, where D≥1. Each partition unit 215 is coupled to one or more dynamic random access memories (DRAMs) 220 residing within PPM memory 204. In one embodiment, the number of partition units 215 equals the number of DRAMs 220, and each partition unit 215 is coupled to a different DRAM 220. In other embodiments, the number of partition units 215 may be different than the number of DRAMs 220. Persons of ordinary skill in the art will appreciate that a DRAM 220 may be replaced with any other technically suitable storage device. In operation, various render targets, such as texture maps and frame buffers, may be stored across DRAMs 220, allowing partition units 215 to write portions of each render target in parallel to efficiently use the available bandwidth of PP memory 204.

A given GPC 208 may process data to be written to any of the DRAMs 220 within PP memory 204. Crossbar unit 210 is configured to route the output of each GPC 208 to the input of any partition unit 215 or to any other GPC 208 for further processing. GPCs 208 communicate with memory interface 214 via crossbar unit 210 to read from or write to various DRAMs 220. In one embodiment, crossbar unit 210 has a connection to I/O unit 205, in addition to a connection to PP memory 204 via memory interface 214, thereby enabling the processing cores within the different GPCs 208 to communicate with system memory 104 or other memory not local to PPU 202. In the embodiment of FIG. 2, crossbar unit 210 is directly connected with I/O unit 205. In various embodiments, crossbar unit 210 may use virtual channels to separate traffic streams between the GPCs 208 and partition units 215.

Again, GPCs 208 can be programmed to execute processing tasks relating to a wide variety of applications, including, without limitation, linear and nonlinear data transforms, filtering of video and/or audio data, modeling operations (e.g., applying laws of physics to determine position, velocity and other attributes of objects), image rendering operations (e.g., tessellation shader, vertex shader, geometry shader, and/or pixel/fragment shader programs), general compute operations, etc. In operation, PPU 202 is configured to transfer data from system memory 104 and/or PP memory 204 to one or more on-chip memory units, process the data, and write result data back to system memory 104 and/or PP memory 204. The result data may then be accessed by other system components, including processor 102, another PPU 202 within parallel processing subsystem 112, or another parallel processing subsystem 112 within computer system 100.

As noted above, any number of PPUs 202 may be included in a parallel processing subsystem 112. For example, multiple PPUs 202 may be provided on a single add-in card, or multiple add-in cards may be connected to communication path 113, or one or more of PPUs 202 may be integrated into a bridge chip. PPUs 202 in a multi-PPU system may be identical to or different from one another. For example, different PPUs 202 might have different numbers of processing cores and/or different amounts of PP memory 204. In implementations where multiple PPUs 202 are present, those PPUs may be operated in parallel to process data at a higher throughput than is possible with a single PPU 202. Systems incorporating one or more PPUs 202 may be implemented in a variety of configurations and form factors, including, without limitation, desktops, laptops, handheld personal computers or other handheld devices, servers, workstations, game consoles, embedded systems, and the like.

Power-Supply Noise and Adaptive-Clock Aware IC Design Testing

When executing the pre-silicon testing application 103, computer system 100 of FIG. 1 functions as a pre-silicon testing system and performs one or more of the power-supply noise and adaptive-clock aware timing techniques described herein. Further, the PPU 202 of FIG. 2 may be implemented as one or more integrated circuits. Accordingly, the PPU 202 is representative of an integrated circuit design to which the disclosed techniques may be applied. Additionally or alternatively, the disclosed techniques may be applied to any technically feasible integrated circuit or integrated circuit design.

In operation, the pre-silicon testing application 103 performs a voltage simulation followed by voltage aware timing simulation of an integrated circuit design. To begin the voltage and timing analysis, the pre-silicon testing application 103 performs a static timing analysis of the integrated circuit design to determine the path delay through each circuit path included in the integrated circuit design. The pre-silicon testing application 103 determines those circuit paths that have longer path delays relative to other circuit paths included in the integrated circuit. The pre-silicon testing application 103 designates the circuit paths with longer path delays as critical paths The pre-silicon testing application 103 then identifies the top IV' critical paths that are the slowest paths within the integrated circuit design, according to the static timing analysis. These top N critical paths may include the circuit paths that are limiting the maximum frequency of the integrated circuit. The value of N may be received via input from a user. Additionally or alternatively, the value of N may be based on any technically feasible factor, including, without limitation, the computing resources of the computer system 100, the time available until the integrated circuit design is released for fabrication and packaging, and the nature or type of integrated circuit design. With regard to the latter factor, integrated circuit designs vary in terms of the number and nature of critical paths. In some integrated circuit designs, the number of critical paths may be relatively low and the critical paths may be relatively easy to identify. Other integrated circuit designs may have critical paths numbering in the hundreds or thousands, and may be difficult to identify. By varying the number of critical paths selected for path-by-path analysis, the pre-silicon testing application 103 balances the importance of identifying the critical paths that are actually limiting the performance of the integrated circuit design versus the time and computing resources available to perform the analysis. In this manner, the pre-silicon testing application 103 efficiently identifies the circuit paths that most likely need to be addressed in order to achieve the highest potential operating frequency for a given supply voltage.

The pre-silicon testing application 103 applies a voltage waveform to the input of each of these critical paths, where the voltage waveform is in the form of a vector of the input voltage over time. The pre-silicon testing application 103 performs a vector-based noise simulation. The vector-based noise simulation performs a vector-based IR drop analysis on the set of critical paths in order to determine the voltage waveform at each gate in each critical path. Additionally or alternatively, the pre-silicon testing application 103 applies a voltage waveform to the input of each of these critical paths, where the voltage waveform of the input voltage over time is vector-less. In such cases, the pre-silicon testing application 103 performs a vector-less noise simulation. The vector-less noise simulation performs a vector-less IR drop analysis on the set of critical paths in order to determine the voltage waveform at each gate in each critical path.

When performing the noise simulation, the pre-silicon testing application 103 analyzes the on-die power grid, physical layout, packaging, and other factors in order to compute the voltage waveform at each gate of each critical path. In addition, the pre-silicon testing application 103 computes the voltage of the rising transition of the voltage separately from the falling transition, thereby increasing the accuracy of the voltage waveform at each gate. Further, the pre-silicon testing application 103 computes the power supply noise and ground path noise separately for each gate. As a result, the pre-silicon testing application 103 preserves the available temporal and spatial effects on the voltage waveform at each gate.

In parallel, the pre-silicon testing application 103 extracts the netlists for the top set of critical paths from the integrated circuit design. The netlist includes a description of each circuit trace, gate, and other circuit element that affects the corresponding critical path. By extracting netlists for only the identified critical paths, the pre-silicon testing application 103 efficiently performs a path-by-path analysis of the critical paths while not analyzing circuit paths that are not limiting the performance of the integrated circuit design. The pre-silicon testing application 103 extracts critical paths with fixed voltage, based on the static timing analysis.

The pre-silicon testing application 103 applies the per-gate voltage waveforms to the fixed voltage netlists for each critical path. The pre-silicon testing application 103 annotates each netlist with the per-gate voltage waveforms. More specifically, the pre-silicon testing application 103 identifies the gates associated with each of the extracted netlists. The pre-silicon testing application 103 determines a voltage at each gate based on one or more voltage waveforms. The voltage waveforms may include a supply voltage waveform, a ground signal waveform, and an input voltage waveform, in any technically feasible combination. The pre-silicon testing application 103 modifies the netlists by annotating the netlists with the voltage at each gate to generate a first annotated netlists.

The pre-silicon testing application 103 then performs a path-by-path timing simulation based on the annotated netlists, including temporal and spatial information of the integrated circuit design. When performing the path-by-path timing simulation, the pre-silicon testing application 103 selects either a fixed-frequency clock generator or a noise-adaptive clock generator in order to compute timing margins based on the relevant clock source.

If the integrated circuit design includes a fixed-frequency clock generator, then the pre-silicon testing application 103 applies a model of a fixed-frequency clock to the annotated netlists. The clock output of the fixed-frequency clock generator operates at a fixed frequency. The pre-silicon testing application 103 determines the clock cycle duration of the fixed frequency. The pre-silicon testing application 103 determines slack times based on a difference between the clock cycle duration of the fixed frequency and a path delay of the annotated netlists.

If the integrated circuit design includes a noise-adaptive clock generator, then the pre-silicon testing application 103 applies a model of a noise-adaptive clock to the annotated netlists. The clock output of the noise-adaptive clock generator operates at a frequency that varies with changes in the supply voltage. The pre-silicon testing application 103 determines the clock output frequency based on the value of the supply voltage. The pre-silicon testing application 103 determines the clock cycle duration of the clock output frequency. The pre-silicon testing application 103 determines slack times based on a difference between the clock cycle duration of the clock output frequency and a path delay of the annotated netlists. When the supply voltage changes from a first value to a second value, the pre-silicon testing application 103 determines the new clock output frequency based on the second value of the supply voltage and repeats the process set forth above.

The pre-silicon testing application 103 performs the timing analysis on the annotated netlists to determine a set of slack times that correspond to a set of voltages applied to the integrated circuit. The pre-silicon testing application 103 produces an ordered list of critical paths. In so doing, the pre-silicon testing application 103 determines, based on the set of slack times, the critical path that has the lowest slack time relative to all other critical paths. In this manner, the ordered list identifies the circuit paths most likely to be the limiting performance factors for the integrated circuit.

After performing path-by-path timing simulation, the pre-silicon testing application 103 generates one or more metrics that compare the results of the path-by-path timing simulation with the results of the static timing analysis. In this manner, the pre-silicon testing application 103 measures the amount of improvement resulting from the path-by-path timing simulation. The pre-silicon testing application 103 generates the one or more metrics across various dimensions, including, without limitation, spatial information, temporal information, frequency versus time, and slack versus time.

In one example, the pre-silicon testing application 103 identifies, based on the static timing analysis, a portion of the critical paths that have a first static slack value. The pre-silicon testing application 103 identifies a portion of the one or more annotated netlists that correspond with the portion of the critical paths that have the first static slack value. The pre-silicon testing application 103 orders the portion of the annotated netlists in order of slack time. In this manner, the pre-silicon testing application 103 identifies annotated netlists included in the portion of the annotated netlists that have lower slack times relative to other annotated netlists included in the portion of the pre-silicon testing application 103 netlists.

In another example, the pre-silicon testing application 103 identifies, based on the static timing analysis, a static slack value for each critical path. The pre-silicon testing application 103 then generates a metric based on a difference between the slack time from the path-by-path timing analysis performed on the annotated paths and the static slack values from the static timing analysis.

The voltage and timing simulation performed by the pre-silicon testing application 103 is now described in further detail.

Figure 3:
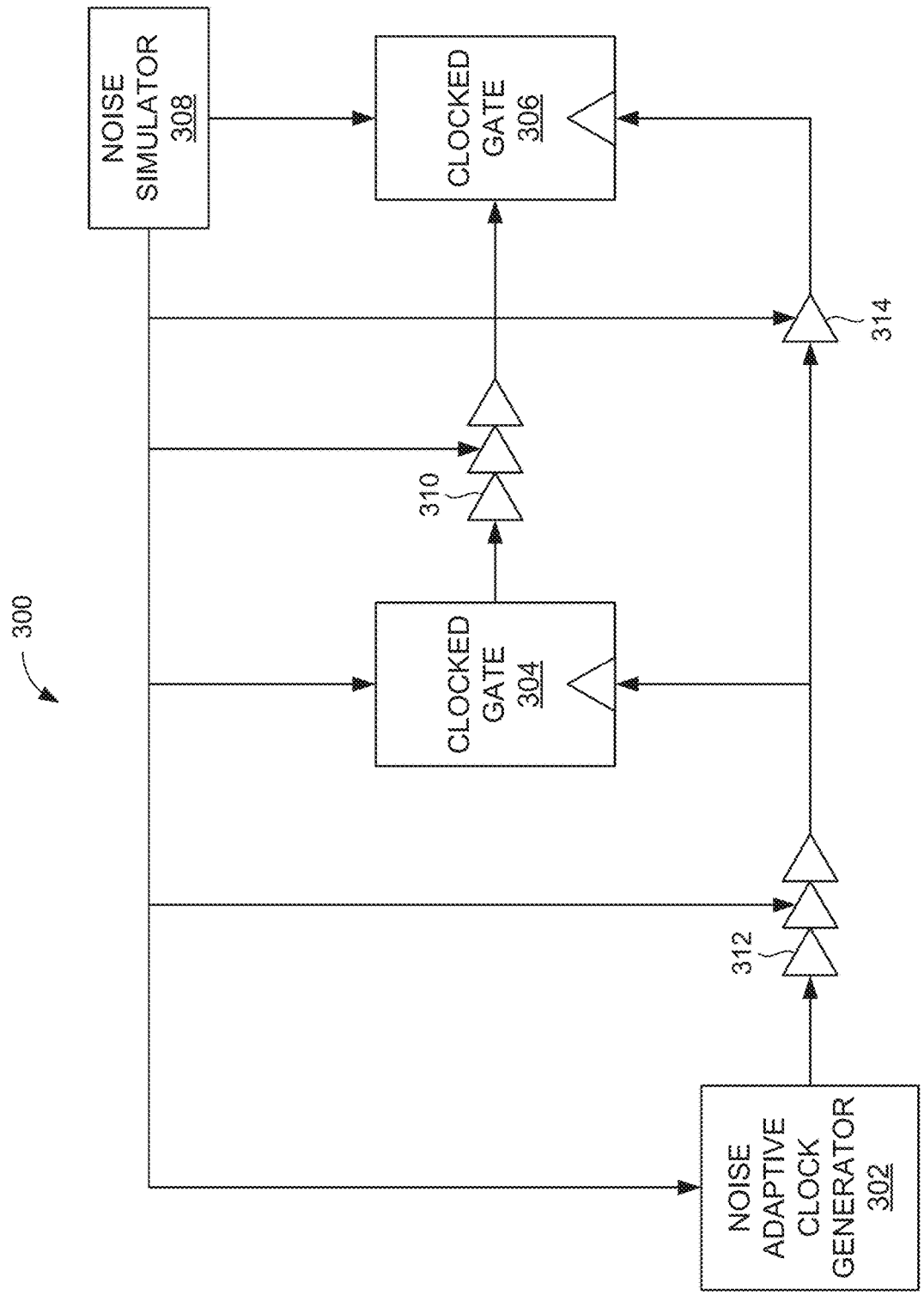
FIG. 3 is a block diagram of a critical path netlist that includes a noise-adaptive clock generator, according to various embodiments.

FIG. 3 is a block diagram of a critical path netlist 300 that includes a noise-adaptive clock generator 302, according to various embodiments. In some embodiments, the critical path netlist 300 may be associated with one or more integrated circuits that include the PPU 202 of FIG. 2. As shown, the critical path netlist 300 includes a noise-adaptive clock generator 302, clocked gates 304 and 306, a noise simulator 308, and delay elements 310, 312, and 314.

The noise-adaptive clock generator 302 transmits a clock output 320 to clocked gates 304 and 306. Clocked gate 304 receives the clock output 320 via delay element 312. Similarly, clocked gate 306 receives the clock output 320 via delay elements 312 and 314. Clocked gate 304 transmits a data signal to clocked gate 306 via delay element 310. Delay elements 310, 312, and 314 are representative of the data and clock circuit path delays between clock generator 302, clocked gate 304, and clocked gate 306. The noise simulator 308 transmits noise waveforms to various circuit elements, including, without limitation, the clock generator 302 and delay elements 310, 312, and 314. Each circuit element receives one or more unique noise waveforms that are particular to the temporal and spatial information for that particular circuit element. Accordingly, each of the clock generator 302 and delay elements 310, 312, and 314 receive different noise waveforms that are accurate for the particular circuit element. In some embodiments, each circuit element receives a noise waveform for the supply voltage and a separate noise waveform for the ground connection. In this manner, the circuit element accurately responds to power supply noise and ground bounce effects.

The delay represented by clocked gates 304 and 306 and delay elements 310, 312, and 314 may vary based on the amount of noise in the supply voltage. Accordingly, the noise simulator 308 transmits noise waveform to clocked gates 304 and 306 and delay elements 310, 312, and 314. In response, the delays through clocked gates 304 and 306 and delay elements 310, 312, and 314 vary based on the noise waveform transmitted by the noise simulator 308.

In operation, the adaptive clock generator 302 varies the frequency of the clock output 320 based on one or more noise waveforms received from the noise simulator 308. The adaptive clock generator 302 includes a noise-aware frequency locked loop (NAFLL) that changes the frequency of the clock output 320 based on the amount of noise present in the supply voltage. Additionally or alternatively, the adaptive clock generator 302 includes any other technically feasible circuit for changing the frequency of the clock output 320 in response to noise in the supply voltage.

If the one or more noise waveforms indicate that the supply voltage has decreased, then the adaptive clock generator 302 decreases the frequency of the clock output 320. When the supply voltage decreases, the delay through clocked gates 304 and 306 and delay elements 310, 312, and 314 increases. By decreasing the frequency of the clock output 320, the clocked gates 304 and 306 are clocked at a lower frequency, thereby accommodating the increased delays and avoiding a timing failure. Similarly, if the one or more noise waveforms indicate that the supply voltage has increased, then the adaptive clock generator 302 increases the frequency of the clock output 320. When the supply voltage increases, the delay through clocked gates 304 and 306 and delay elements 310, 312, and 314 decreases. By increasing the frequency of the clock output 320, the clocked gates 304 and 306 are clocked at a higher frequency, thereby improving performance. By correctly modeling the adaptive clock generator 302, the behavior of the critical path netlist 300 is more accurate, leading to a more accurate path-by-path timing simulation.

Figure 4:
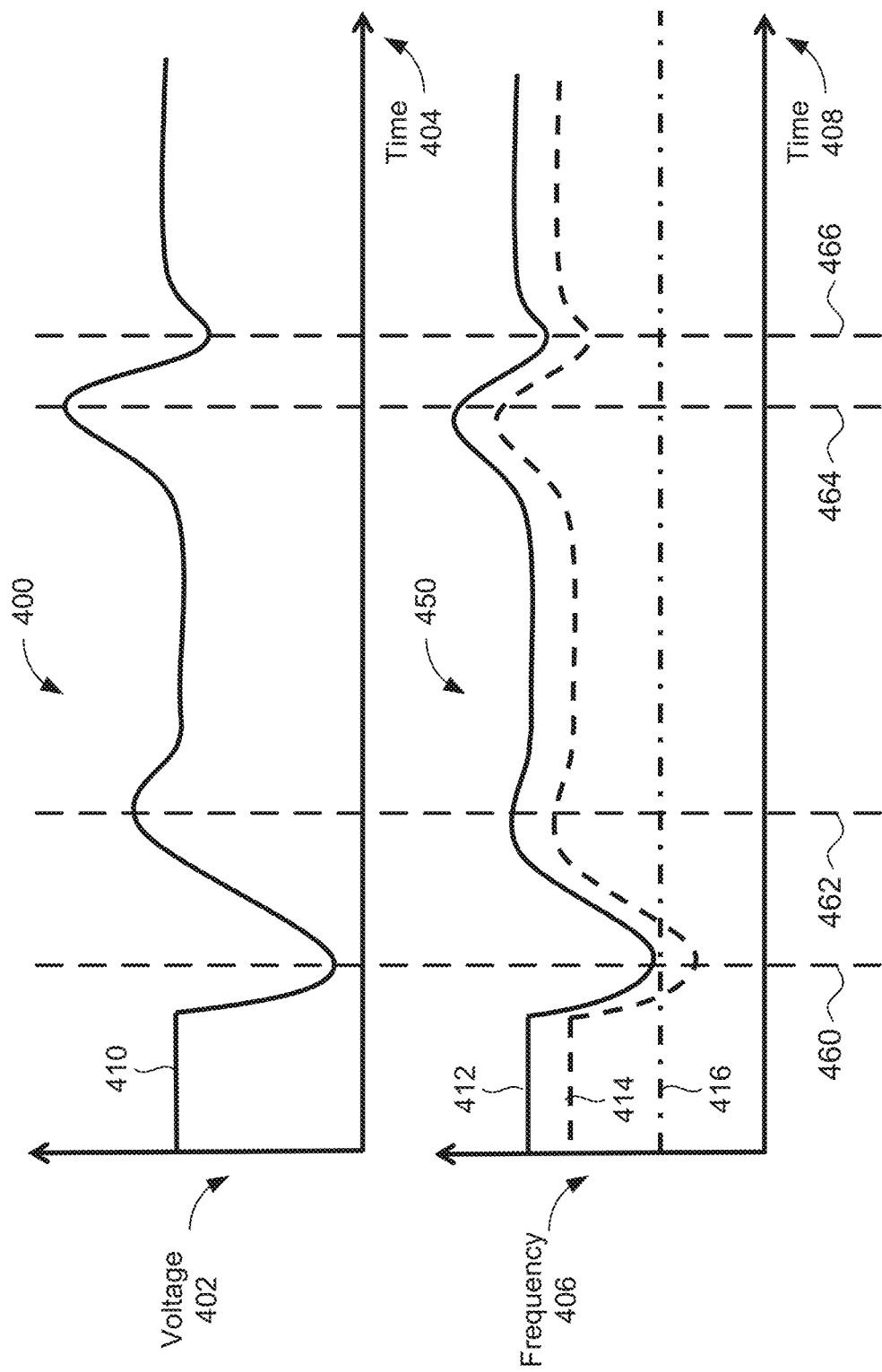
FIG. 4 illustrates a voltage graph and frequency graph associated with the critical path netlist of FIG. 3, according to various embodiments.

FIG. 4 illustrates a voltage graph 400 and frequency graph 450 associated with the critical path netlist 300 of FIG. 3, according to various embodiments. As shown, the voltage graph 400 illustrates voltage 402 over time 404. The voltage graph 400 includes a waveform of the supply voltage 410. The frequency graph 450 illustrates frequency 406 over time 408. The frequency graph 450 includes waveforms of the maximum integrated circuit frequency 412, the clock output frequency 414 with adaptive clocking and the clock output frequency 416 without adaptive clocking.

The supply voltage 410 varies over time based on IR drop and other noise present in the supply voltage 410. In particular, the supply voltage 410 falls below the nominal voltage at times 460 and 466 and rises above the nominal voltage at times 462 and 464. Correspondingly, the maximum integrated circuit frequency 412 also decreases at times 460 and 466 and increases at times 462 and 464. Without adaptive clocking, the clock output frequency 416 is set to a fixed-frequency that is guaranteed to be no higher than the worst case maximum integrated circuit frequency 412 at time 460. However, for most of the time shown in frequency graph 450, the maximum integrated circuit frequency 412 is above the clock output frequency 416. As a result, the fixed clock output frequency 416 represents a lost opportunity to operate the integrated circuit at a higher frequency for greater performance.

With adaptive clocking, the clock output frequency 414 varies over time and follows the maximum integrated circuit frequency 412 less some margin of error. As a result, the clock output frequency 414 decreases at times 460 and 466 and increases at times 462 and 464 in response to changes in the supply voltage 410. As a result, the clock output frequency 414 with adaptive clocking is higher than the clock output frequency 416 without adaptive clocking for most of the time represented by the frequency graph 450. As a result, the integrated circuit operates with higher performance when adaptive clocking is employed.

Figure 5:
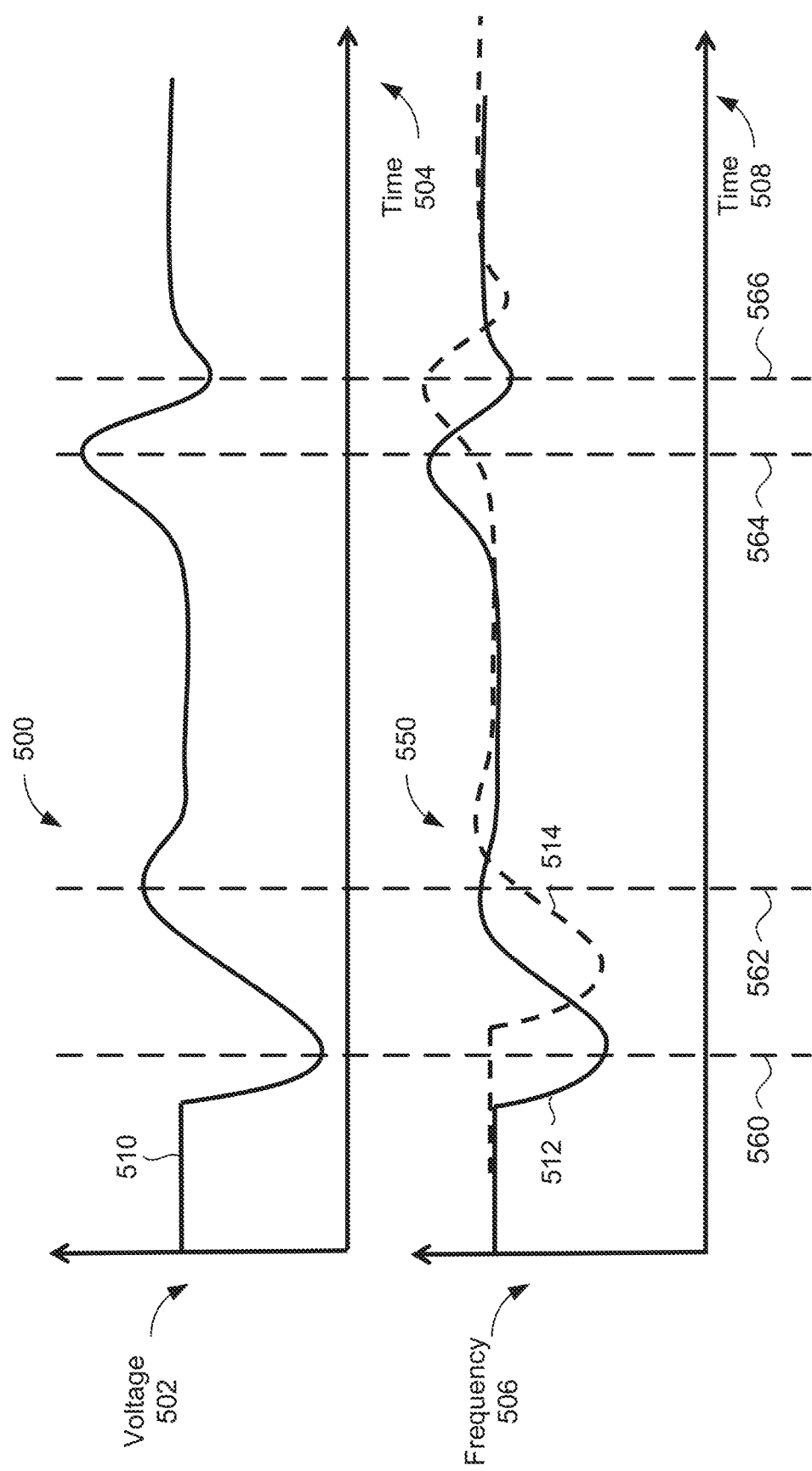
FIG. 5 illustrates another voltage graph and frequency graph associated with the critical path netlist of FIG. 3, according to various other embodiments.

FIG. 5 illustrates another voltage graph 500 and frequency graph 550 associated with the critical path netlist 300 of FIG. 3, according to various other embodiments. As shown, the voltage graph 500 illustrates voltage 502 over time 504. The voltage graph 500 includes a waveform of the supply voltage 510. The frequency graph 550 illustrates frequency 506 over time 508. The frequency graph 550 includes waveforms of the clock frequency 512 at a first circuit element and the clock frequency 514 at a second circuit element.

The supply voltage 510 varies over time based on IR drop and other noise present in the supply voltage 510. In particular, the supply voltage 510 falls below the nominal voltage at times 560 and 566 and rises above the nominal voltage at times 562 and 564. Correspondingly, the clock frequency 512 at the first circuit element also decreases at times 560 and 566 and increases at times 562 and 564. The clock frequency 512 at the first circuit element remains below the maximum integrated circuit frequency (not shown) for the duration of time shown in the frequency graph 550. Consequently, the first circuit operates correctly without timing errors.

The clock frequency 514 at the second circuit element is delayed relative to the clock frequency 512 at the first circuit element. Such a delay may be due to different clock path lengths from the clock generator 302 to the first circuit element and the second circuit element.

The clock frequency 514 at the second circuit element remains below the maximum integrated circuit frequency (not shown) for much of the duration of time shown in the frequency graph 550. However, at time 566, the supply voltage 510 decreases, while the delayed clock frequency 514 at the second circuit increases as a result of the increase in supply voltage 510 at time 564. Therefore, at time 566, the clock frequency 514 at the second circuit element is higher than the maximum integrated circuit frequency, resulting in a timing error. Because of the potential for timing errors when adaptive clocking is employed, the pre-silicon testing application 103 models both clock path delay and data path delay. In addition, the pre-silicon testing application 103 generates noise waveforms that are unique to each circuit element, taking the clock path delay and data path delay into account. In this manner, the pre-silicon testing application 103 is able to identify those critical paths which may be subject to timing errors, such as the timing error exhibited by the clock frequency 514 at the second circuit.

Figure 6:
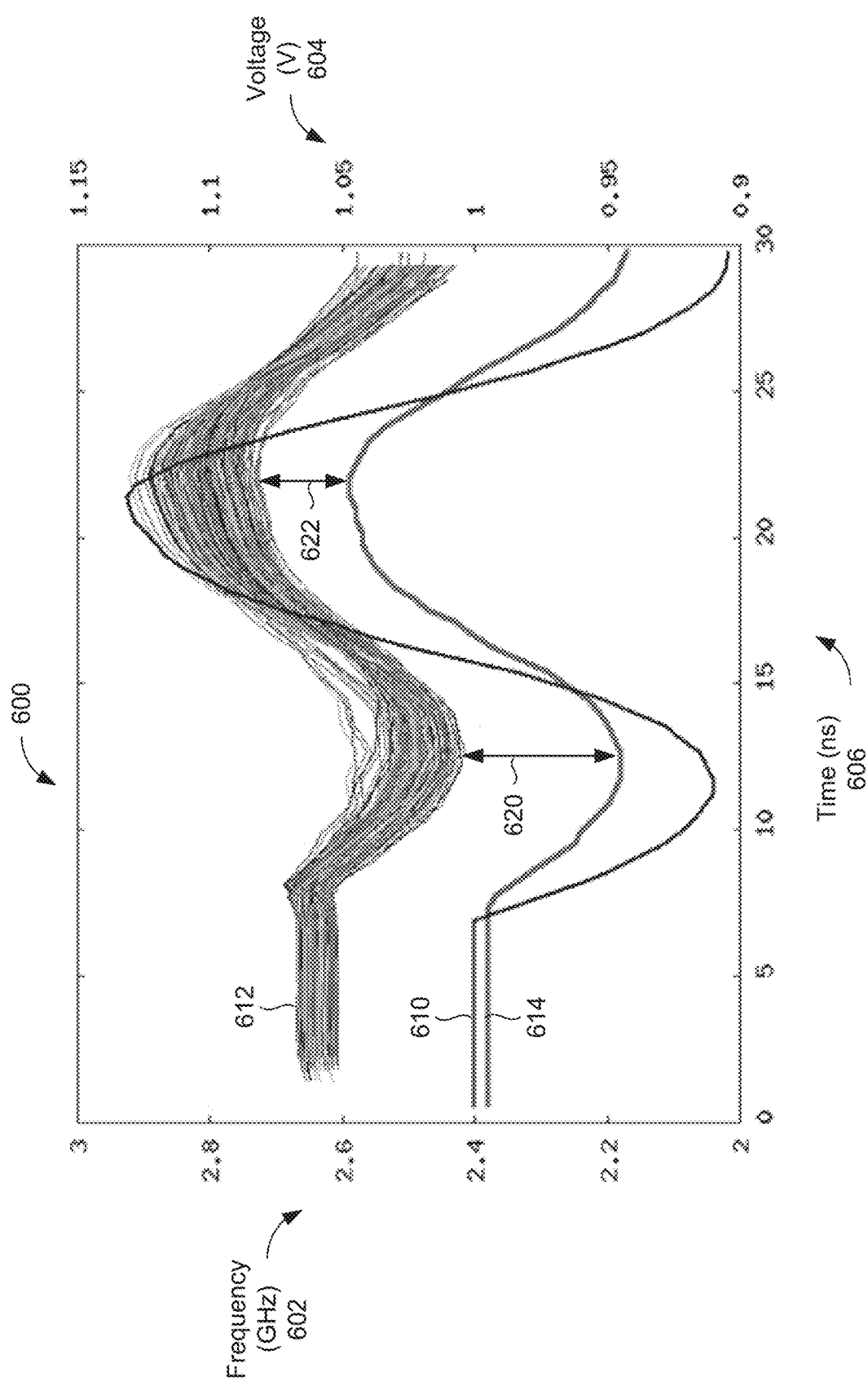
FIG. 6 illustrates a voltage/frequency graph associated with the critical path netlist of FIG. 3, according to various embodiments.

FIG. 6 illustrates a voltage/frequency graph 600 associated with the critical path netlist 300 of FIG. 3, according to various embodiments. As shown, the voltage/frequency graph 600 illustrates frequency 602 and voltage 604 over time 606. The voltage/frequency graph 600 includes a waveform of the supply voltage 610. The voltage/frequency graph 600 further includes waveforms of the critical path frequencies 612 and the clock output frequency 614.

At 5 ns, the supply voltage 610 is at the nominal voltage of approximately 1 volt. The critical path frequencies 612 vary from approximately 2.6 GHz to 2.7 GHz. The clock output frequency 614 is set somewhat lower, at 2.4 GHz, in order to provide timing margin between the critical path frequencies 612 and the clock output frequency 614. From approximately 7 ns to 12 ns, the supply voltage 610 decreases from approximately 1 volt to 0.9 volts. The condition where the supply voltage falls below the nominal voltage is referred to herein as "undershoot." Correspondingly, the critical path frequencies 612 decrease over the same period to a range of approximately 2.45 GHz to 2.6 GHz. Then, from approximately 12 ns to 22 ns, the supply voltage 610 increases from approximately 0.9 volts to over 1.1 volts. The condition where the supply voltage rises above the nominal voltage is referred to herein as "overshoot." Correspondingly, the critical path frequencies 612 increase over the same period to a range of approximately 2.7 GHz to 2.9 GHz.

If only IR STA analysis was performed, the timing analysis would identify the worst case critical paths based on the worst case path frequencies resulting from STA. However, this method would not analyze the effects of dynamic variation in supply voltage 610 and clock output frequency 614.

By contrast, via the disclosed techniques, the pre-silicon testing application 103 generates frequency and voltage variations over time, as illustrated in FIG. 6. The pre-silicon testing application 103 performs an IR drop analysis and applies a voltage waveform, such as supply voltage 610, to each of the critical paths. The pre-silicon testing application 103 then performs a path-by-path timing simulation, resulting in a graph illustrating how the maximum critical path frequencies 612 at which each critical path can operate changes over time. This type of information is not available from an IR STA analysis.

In this regard, FIG. 6 illustrates that, although the critical path frequencies 612 are at their lowest at 12 ns, the margin 620 between the critical path frequencies 612 and the clock output frequency 614 is relatively large. This is because the clock output frequency 614 is also decreasing during this same period in response to the decrease in supply voltage 610. At 22 ns, the clock output frequency 614 is increasing in response to the increase in supply voltage 610. However, the margin 622 between the critical path frequencies 612 and the clock output frequency 614 is relatively small. Because the pre-silicon testing application 103 analysis temporal and spatial effects on the critical paths, the pre-silicon testing application 103 correctly identifies the worst case critical paths based on the critical path frequencies 612 at 22 ns, when the margin 622 is relatively small.

In addition to characterizing how critical path frequencies 612 vary over time, the pre-silicon testing application 103 characterizes critical paths based on how dynamic slack for each critical path changes over time. These techniques are now described.

Figure 7:
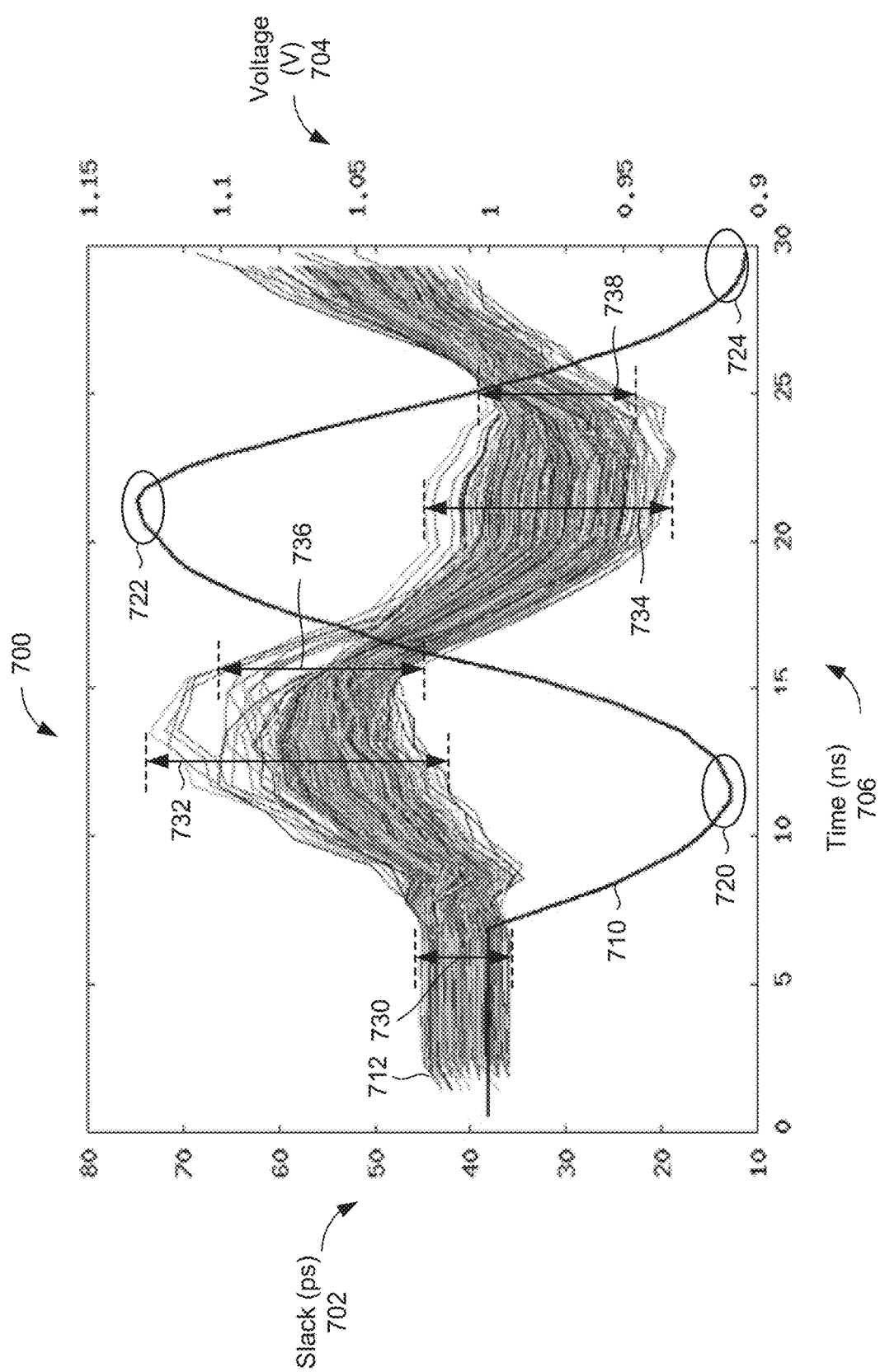
FIG. 7 illustrates a voltage/slack graph associated with the critical path netlist of FIG. 3, according to various embodiments.

FIG. 7 illustrates a voltage/slack graph 700 associated with the critical path netlist 300 of FIG. 3, according to various embodiments. As shown, the voltage/slack graph 700 illustrates slack 702 and voltage 704 over time 706. The voltage/slack graph 700 includes a waveform of the supply voltage 710. The voltage/slack graph 700 further includes waveforms of the critical path slack times 712.

At 5 ns, the supply voltage 710 is at the nominal voltage of approximately 1 volt. The critical path slack times 712 vary within a range 730 of approximately 38 ps to 45 ps. From approximately 7 ns to 12 ns, the supply voltage 710 decreases from approximately 1 volt to a maximum undershoot 720 of 0.9 volts at 12 ns. Normally, this undershoot 720 would cause the path delay though each critical path to increase, resulting in lower slack times. However, the clock output frequency (not shown) also decreases as the supply voltage 710 decreases. As a result, the critical path slack times 712 actually increase to a range 732 of approximately 40 ps to 75 ps.

Then, from approximately 12 ns to 22 ns, the supply voltage 710 increases from approximately 0.9 volts to a maximum overshoot 722 that exceeds 1.1 volts. Normally, this overshoot 722 would cause the path delay though each critical path to decrease, resulting in higher slack times. However, the clock output frequency also increases as the supply voltage 710 increases. As a result, the critical path slack times 712 actually decrease to a range 734 of approximately 18 ps to 45 ps.

If only IR STA analysis was performed, the timing analysis would identify the worst case critical paths based worst case slack resulting from STA. However, this method would not analyze dynamic slack due to dynamic variation in supply voltage 710 and clock output frequency. By contrast, via the disclosed techniques, the pre-silicon testing application 103 generates slack time and voltage variations over time, as illustrated in FIG. 7. As a result, pre-silicon testing application 103 correctly identifies that the worst case critical path slack times 712 occur at the overshoot 722 at 22 ns rather than at the relatively higher critical path slack times 712 occurring at the undershoot 720 at 12 ns.

In addition, pre-silicon testing application 103 analyzes the critical path slack times 712 when the supply voltage 710 transitions between undershoot and overshoot conditions. In such cases, the output clock frequency decreases or increases with corresponding decreases and increases in the supply voltage 710. However, the change in output clock frequency may reach certain circuit elements before or after the change in the supply voltage 710. This discrepancy may result in timing errors, as described in conjunction with FIG. 5. Therefore, pre-silicon testing application 103 analyzes critical path slack times 712 over range 736 as the supply voltage 710 increases from undershoot 720 to overshoot 722. Similarly, pre-silicon testing application 103 analyzes critical path slack times 712 over range 738 as the supply voltage 710 decreases from overshoot 722 to undershoot 724. In this manner, pre-silicon testing application 103 correctly analyzes critical path slack times 712 during transitions of the supply voltage 710 as well as during undershoot and overshoot conditions of the supply voltage 710.

Figure 8:
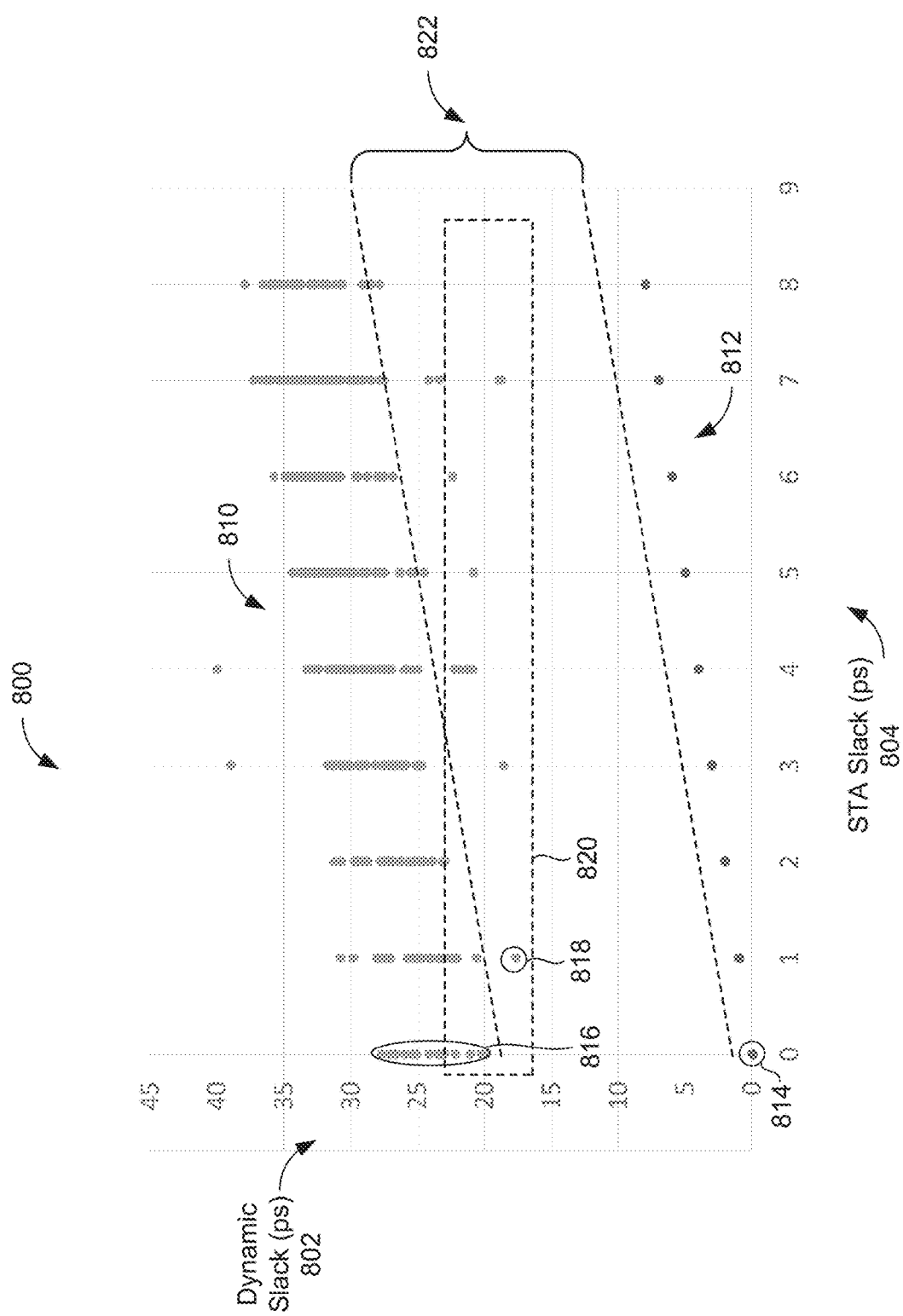
FIG. 8 illustrates a slack comparison graph associated with the critical path netlist of FIG. 3, according to various embodiments.

FIG. 8 illustrates a slack comparison graph 800 associated with the critical path netlist 300 of FIG. 3, according to various embodiments. As shown, the slack comparison graph 800 illustrates dynamic slack 802 versus STA slack 804.

Typically, the goal of timing analysis is to increase the overall slack of the integrated circuit. Slack is the amount of timing margin available before an actual functional failure occurs due to insufficient timing margin. As long as the slack is at or above zero, the integrated circuit functions without timing failures. If the clock output frequency is increased until slack is less than zero, then the delay through some circuit paths exceeds the available cycle time of the clock output. In such conditions, a timing failure may occur, resulting in a functional failure of the integrated circuit.

Timing analysis identifies the circuit paths with the lowest slack. A designer may then use the results of the timing analysis to optimize one or more of these critical paths. The circuit paths with the lowest slack set the maximum frequency at which the integrated circuit is able to operate without timing failure. In order to increase the maximum operating frequency or improve timing margins, the designer redesigns portions of the circuit paths with the lowest slack to reduce the total path delay, thereby increasing slack. With the redesigned circuit paths, the integrated circuit may operate at a higher frequency. Additionally or alternatively, with the redesigned circuit paths, the integrated circuit may operate with improved timing margins.

In the case of IR STA, only the worst case slack is determined for each circuit path, even though the actual slack may be higher during operation, when temporal and spatial effects on slack are taken into consideration. By contrast, with the disclosed techniques, the pre-silicon testing application 103 computes the dynamic slack over time, considering temporal and spatial effects on slack as well as the effects of a noise-adaptive clock generator.

As shown in FIG. 8, STA slack 804, as shown in the static slack region 812 of the slack comparison graph 800, is pessimistically low. Because STA does not consider any dynamic effects, the y-axis value is set to the same as the x-axis value. Therefore if the STA slack is 0 ps, then all critical paths with an STA slack of 0 ps (x=0) are set at 0 ps on the y-axis as well (y=0). As a result, the critical paths with an STA slack of 0 ps are superimposed on top of one another within region 814 on the slack comparison graph 800. Similarly, if the STA slack is 1 ps, then all critical paths with an STA slack of 1 ps (x=1) are set at 1 ps on the y-axis (y=1), and so on. As one example, the number of critical paths superimposed on top of one another within region 814 could be 10, 20, 100, or more critical paths. With only an STA analysis, all of the points included within region 814 would need to be improved in order to increase STA slack 804.

By contrast, the pre-silicon testing application 103 computes dynamic slack via the techniques disclosed herein, including the dynamic effects due to temporal and spatial effects as well as adaptive clock generation. As a result, the pre-silicon testing application 103 reorders the critical paths included within region 814 and places the reordered critical paths within region 816 based on dynamic slack 802. The dynamic slack 802 of the reordered critical paths within region 816 ranges from approximately 20 ps to 28 ps. The pre-silicon testing application 103 computes dynamic slack 802 for critical paths at other STA slack 804 values as well. The pre-silicon testing application 103 reorders the critical paths at each value of STA slack 804 and places the reordered critical paths based on dynamic slack 802. The reordered critical paths are shown in the dynamic slack region 810 of the slack comparison graph 800. Overall, the critical path with the lowest dynamic slack 802 is included in region 818, with an STA slack 804 of 1 ps and a dynamic slack 802 of approximately 16 ps.

With the information included in the slack comparison graph 800, an integrated circuit designer may then use the results of the timing analysis to optimize one or more of the critical paths that have the lowest slack times. In this manner, the integrated circuit designer is able to improve overall slack of the integrated circuit by increasing slack only for the critical paths with the lowest dynamic slack 802, such as the critical paths within region 820. As a result, overall slack may be increased from approximately 17 ps to 22 ps. Without data regarding dynamic slack 802, an integrated circuit designer would have to increase slack for all of the critical paths with a low value of STA slack 804, whether or not those critical paths need to be improved. This leads to overdesign, represented by region 822, and results in unnecessarily wasting power consumption, die area, and design time. Because the pre-silicon testing application 103 computes dynamic slack 802, the integrated circuit designer is able to improve the voltage-frequency operating point of the integrated circuit by focusing on the critical paths that are actually limiting overall slack.

In some embodiments, dynamic slack 802 has additional applications beyond identifying critical paths prior to releasing an integrated circuit for fabrication and packaging. In one example, the pre-silicon testing application 103 could test the integrated circuit via the disclosed techniques after the integrated circuit has been fabricated and packaged. The pre-silicon testing application 103 could compare the actual results from testing the fabricated integrated circuit with the simulation results from analysis prior to fabrication. The pre-silicon testing application 103 could thereby confirm whether the fabricated integrated circuit performs as expected.

In another example, dynamic slack 802 could inform the optimal location for the clock generator. Because the pre-silicon testing application 103 considers both temporal and spatial effects on circuit path timing, the pre-silicon testing application 103 could compare dynamic slack 802 for various locations of the clock generator. The pre-silicon testing application 103 could identify the clock generator location from among two or more candidate locations that results in the greatest overall slack.

In yet another example, the pre-silicon testing application 103 could apply dynamic slack 802 to reliability and aging analysis. In this manner, the pre-silicon testing application 103 could more accurately predict how overall slack of the integrated circuit is subject to variance due to manufacturing processing variance, aging, and other reliability factors.

Figure 9A:
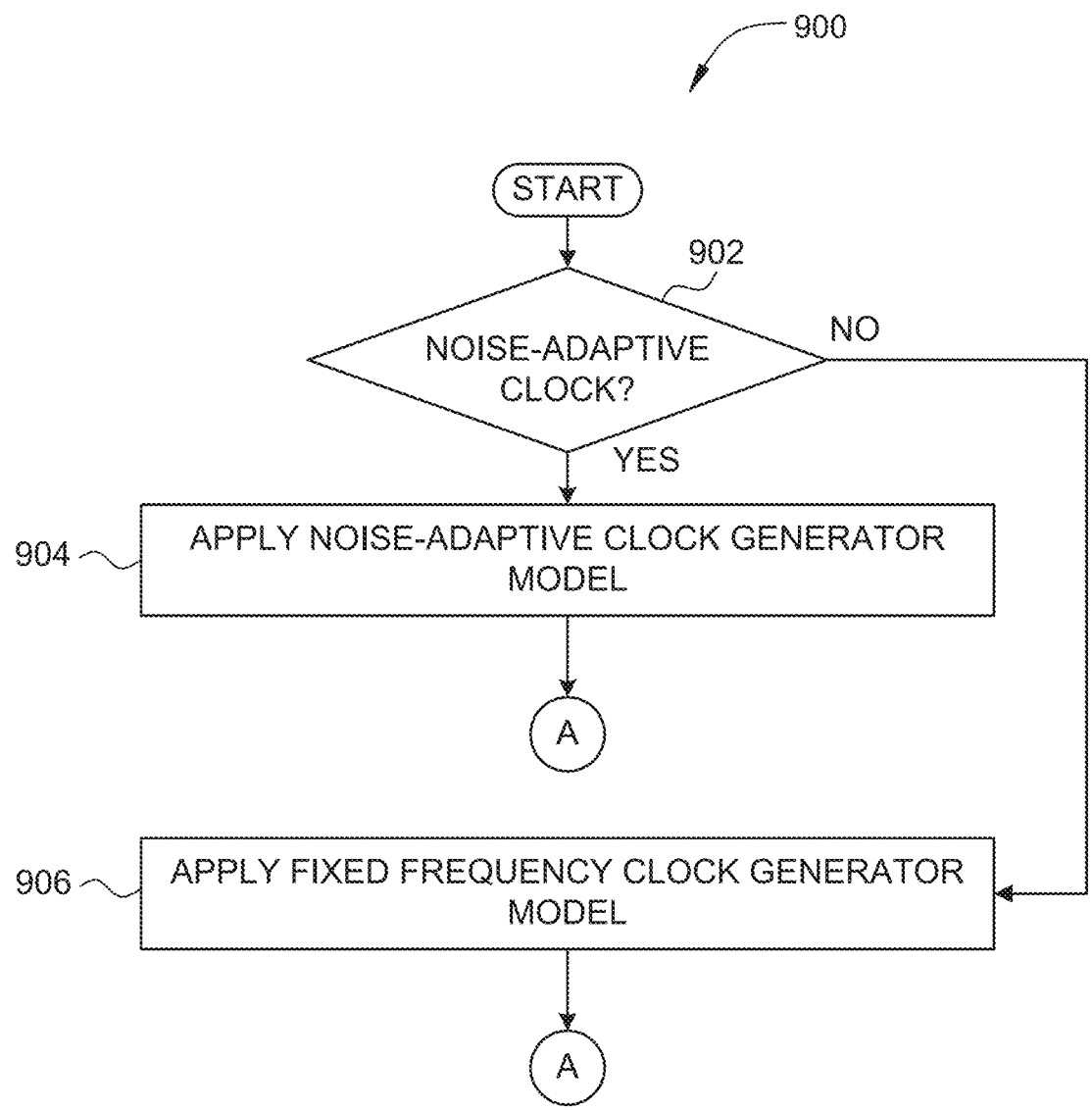
FIGS. 9A-9B set forth a flow diagram of method steps for performing a timing simulation for voltage-annotated path netlists, according to various embodiments.
Figure 9B:
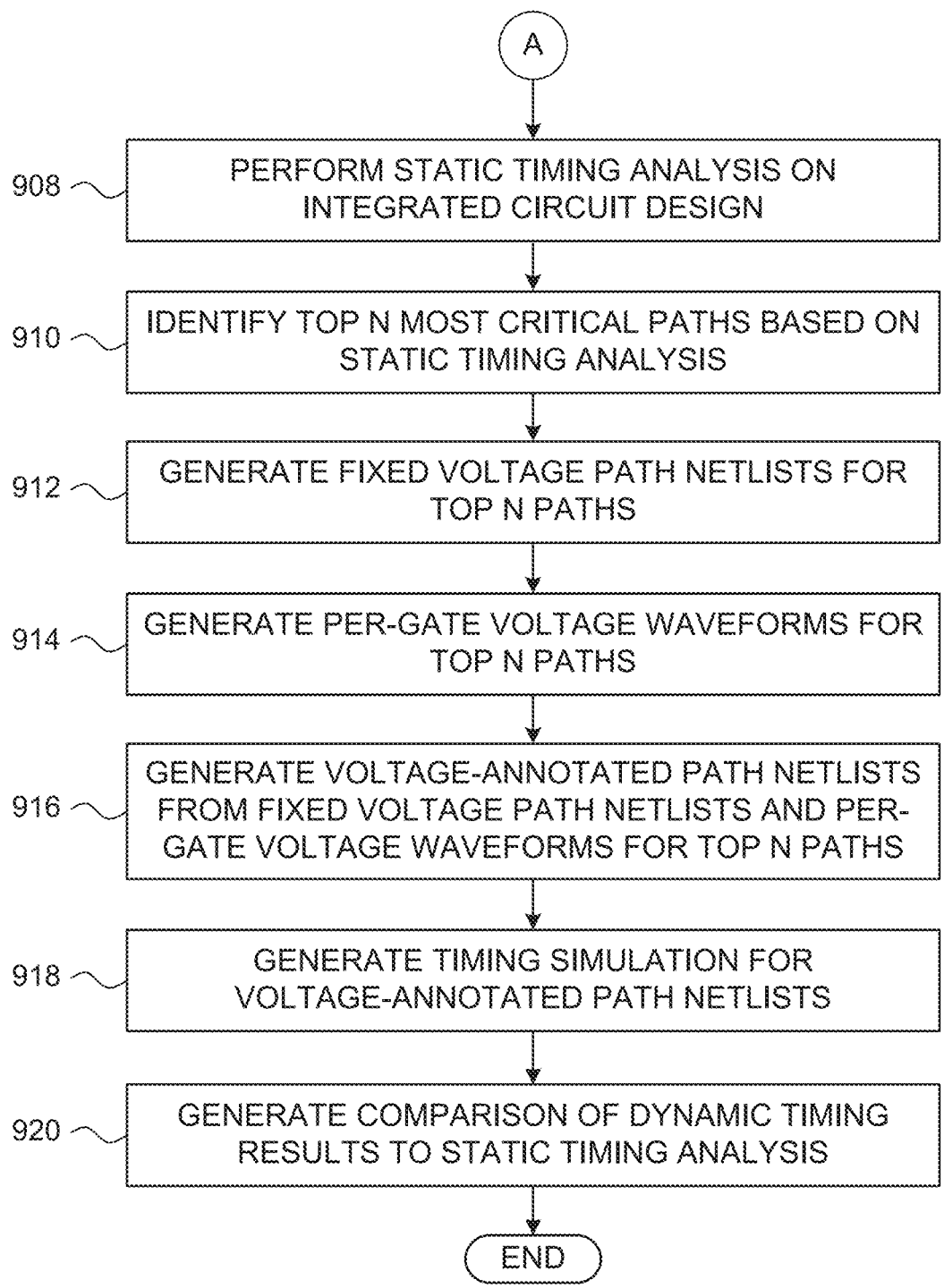

FIGS. 9A-9B set forth a flow diagram of method steps for performing a timing simulation for voltage-annotated path netlists, according to various embodiments. Although the method steps are described in conjunction with the systems of FIGS. 1-8, persons of ordinary skill in the art will understand that any system configured to perform the method steps, in any order, is within the scope of the present disclosure.

As shown, a method 900 begins at step 902, where a pre-silicon testing application 103 executing on a computer system 100 determines whether an integrated circuit design includes a noise-adaptive clock. If the integrated circuit design includes a noise-adaptive clock, then the method 900 proceeds to step 904, where the pre-silicon testing application 103 applies a noise-adaptive clock generator model to the integrated circuit design.

The noise-adaptive clock generator model varies the frequency of the clock output based on the IR drop and noise present in the supply voltage. The adaptive clock generator model includes a noise-aware frequency locked loop (NAFLL) that changes the frequency of the clock output based on the amount of noise present in the supply voltage. Additionally or alternatively, the adaptive clock generator model includes any other technically feasible circuit for changing the frequency of the clock output in response to noise in the supply voltage.

If the integrated circuit design includes a noise-adaptive clock generator, then the pre-silicon testing application 103 applies a model of a noise-adaptive clock to the netlists. The clock output of the noise-adaptive clock generator operates at a frequency that varies with changes in the supply voltage. The pre-silicon testing application 103 determines the clock output frequency based on the value of the supply voltage. The pre-silicon testing application 103 determines the clock cycle duration of the clock output frequency. The pre-silicon testing application 103 determines slack times based on a difference between the clock cycle duration of the clock output frequency and a path delay of the netlists.

If the noise present at the adaptive clock generator model indicates that the supply voltage has decreased, then the adaptive clock generator model decreases the frequency of the clock output. Similarly, if the noise present at the adaptive clock generator model indicates that the supply voltage has increased, then the adaptive clock generator model increases the frequency of the clock output.

Returning to step 902, if, at step 902, the integrated circuit design does not include a noise-adaptive clock, then the method 900 proceeds to step 906, where the pre-silicon testing application 103 applies a fixed-frequency clock generator model to the integrated circuit design. The fixed-frequency clock generator generates a clock output that remains at a constant frequency regardless of any IR drop or noise in the supply voltage. The pre-silicon testing application 103 determines the clock cycle duration of the fixed frequency. The pre-silicon testing application 103 determines slack times based on a difference between the clock cycle duration of the fixed frequency and a path delay of the netlists.

From either step 904 or 906, the method 900 proceeds to step 908, where the pre-silicon testing application 103 performs static timing analysis on the integrated circuit design. The static timing analysis determines the path delay for each circuit path included in the integrated circuit. The pre-silicon testing application 103 determines those circuit paths that have longer path delays relative to other circuit paths included in the integrated circuit. The pre-silicon testing application 103 designates the circuit paths with longer path delays as critical paths.

At step 910, the pre-silicon testing application 103 identifies the top N most critical paths, based on the static timing analysis. The top 'N' critical paths represent the slowest paths within the integrated circuit design, according to the static timing analysis. These top N critical paths may include the circuit paths that are limiting the maximum frequency of the integrated circuit. The value of N may be received via input from a user. Additionally or alternatively, the value of N may be based on any technically feasible factor, including, without limitation, the computing resources of the computer system 100, the time available until the integrated circuit design is released for fabrication and packaging, and the nature or type of integrated circuit design. In this manner, the pre-silicon testing application 103 efficiently identifies the circuit paths that most likely need to be addressed in order to achieve the highest potential operating frequency for a given supply voltage.

At step 912, the pre-silicon testing application 103 generates fixed voltage path netlists for the top N most critical paths. The pre-silicon testing application 103 extracts the netlists for the top set of critical paths from the integrated circuit design. The netlist includes a description of each circuit trace, gate, and other circuit element that affects the corresponding critical path. By extracting netlists for only the identified critical paths, the pre-silicon testing application 103 efficiently performs a path-by-path analysis of the critical paths while not analyzing circuit paths that are not limiting the performance of the integrated circuit design. The pre-silicon testing application 103 extracts critical paths with fixed voltage, based on the static timing analysis.

At step 914, the pre-silicon testing application 103 generates per-gate voltage waveforms for the top N most critical paths. The pre-silicon testing application 103 applies a voltage waveform to the input of each of the critical paths, where the voltage waveform is in the form of a vector of the input voltage over time. The pre-silicon testing application 103 performs a vector-based noise simulation. The vector-based noise simulation performs a vector-based IR drop analysis on the set of critical paths in order to determine the voltage waveform at each gate in each critical path. Additionally or alternatively, the pre-silicon testing application 103 applies a voltage waveform to the input of each of these critical paths, where the voltage waveform of the input voltage over time is vector-less. In such cases, the pre-silicon testing application 103 performs a vector-less noise simulation. The vector-less noise simulation performs a vector-less IR drop analysis on the set of critical paths in order to determine the voltage waveform at each gate in each critical path.

When performing the IR noise simulation, the pre-silicon testing application 103 analyzes the on-die power grid, physical layout, packaging, and other factors in order to compute the voltage waveform at each gate of each critical path. In addition, the pre-silicon testing application 103 computes the voltage of the rising transition of the voltage separately from the falling transition, thereby increasing the accuracy of the voltage waveform at each gate. Further, the pre-silicon testing application 103 computes the power supply noise and ground path noise separately for each gate. As a result, the pre-silicon testing application 103 preserves the available temporal and spatial effects on the voltage waveform at each gate.

At step 916, the pre-silicon testing application 103 generates voltage-annotated path netlists from the fixed voltage path netlists generated for the top N paths at step 912 and the per-gate voltage waveforms generated for the top N paths generated at step 914. The pre-silicon testing application 103 applies the per-gate voltage waveforms to the fixed voltage netlists for each critical path. The pre-silicon testing application 103 then annotates each netlist with the per-gate voltage waveforms.

More specifically, the pre-silicon testing application 103 identifies the gates associated with each of the extracted netlists. The pre-silicon testing application 103 determines a voltage at each gate based on one or more voltage waveforms. The voltage waveforms may include a supply voltage waveform, a ground signal waveform, and an input voltage waveform, in any technically feasible combination. The pre-silicon testing application 103 modifies the netlists by annotating the netlists with the voltage at each gate to generate a first annotated netlists.

At step 918, the pre-silicon testing application 103 generates a timing simulation for the voltage-annotated path netlists. More particularly, the pre-silicon testing application 103 performs a path-by-path timing simulation based on the annotated netlists, including temporal and spatial information of the integrated circuit design. When performing the path-by-path timing simulation, the pre-silicon testing application 103 selects either a fixed-frequency clock generator model or a noise-adaptive clock generator model in order to compute timing margins based on the relevant clock source. The pre-silicon testing application 103 performs the timing analysis on the annotated netlists to determine a set of slack times that correspond to a set of voltages applied to the integrated circuit. The pre-silicon testing application 103 produces an ordered list of critical paths based on the set of slack times. In so doing, the pre-silicon testing application 103 determines, based on the set of slack times, the critical path that has the lowest slack time relative to all other critical paths. In this manner, the ordered list identifies the circuit paths most likely to be the limiting performance factors for the integrated circuit.

At step 920, the pre-silicon testing application 103 generates a comparison of the dynamic timing results to the static timing analysis. In particular, the pre-silicon testing application 103 generates one or more metrics that compare the results of the path-by-path timing simulation with the results of the static timing analysis. In this manner, the pre-silicon testing application 103 measures the amount of improvement resulting from the path-by-path timing simulation. The pre-silicon testing application 103 generates the one or more metrics across various dimensions, including, without limitation, spatial information, temporal information, frequency versus time, and slack versus time.

In one example, the pre-silicon testing application 103 identifies, based on the static timing analysis, a portion of the critical paths that have a first static slack value. The pre-silicon testing application 103 identifies a portion of the one or more annotated netlists that correspond with the portion of the critical paths that have the first static slack value. The pre-silicon testing application 103 orders the portion of the annotated netlists in order of slack time. In this manner, the pre-silicon testing application 103 identifies annotated netlists included in the portion of the annotated netlists that have lower slack times relative to other annotated netlists included in the portion of the pre-silicon testing application 103 netlists.

In another example, the pre-silicon testing application 103 identifies, based on the static timing analysis, a static slack value for each critical path. The pre-silicon testing application 103 then generates a metric based on a difference between the slack time from the path-by-path timing analysis performed on the annotated paths and the static slack values from the static timing analysis. The method 900 then terminates.

In sum, a pre-silicon testing application executing on a computer system performs a voltage simulation followed by voltage aware timing simulation of an integrated circuit design. The pre-silicon testing application performs a static timing analysis of the integrated circuit design to determine the delay through each circuit path in the integrated circuit design. The pre-silicon testing application then selects the top set of critical paths that are the slowest paths according to the static timing analysis. These critical paths may include the circuit paths that are limiting maximum operating frequency of the integrated circuit. The pre-silicon testing application applies a voltage waveform to the input of each of these critical paths. The pre-silicon testing application then propagates the input voltage waveform in order to determine the voltage waveform at each gate in each critical path.

In parallel, the pre-silicon testing application extracts the netlists for the top set of critical paths from the integrated circuit design. The pre-silicon testing application extracts critical paths with fixed voltage, based on the static timing analysis. The pre-silicon testing application then annotates the fixed voltage critical paths with per-gate voltage waveforms. The pre-silicon testing application performs a path-by-path timing simulation based on the annotated critical paths, including temporal and spatial information of the integrated circuit design. In so doing, the pre-silicon testing application selects either a fixed-frequency clock generator or a noise-adaptive clock generator in order to compute timing margins based on the relevant clock source. The pre-silicon testing application produces an ordered list of critical paths. This ordered list identifies the circuit paths most likely to be the limiting performance factors for the integrated circuit.

At least one technical advantage of the disclosed techniques relative to the prior art is that the disclosed techniques enable the temporal, spatial, and adaptive clock effects of integrated circuit designs to be more effectively modeled and analyzed. Accordingly, the more important critical paths within an integrated circuit design can be identified based on a more accurate model of how the integrated circuit behaves in actual operation. As a result, design efforts can more properly focus on the critical paths that actually limit the maximum operating frequency of the integrated circuit and avoid focusing on critical paths that do not substantially impact maximum operating frequency. By implementing the disclosed techniques, among other things, power consumption and die area of the final integrated circuit can be reduced. These technical advantages represent one or more technological improvements over prior art approaches.

1. In some embodiments, a computer-implemented method for pre-silicon testing of a design for an integrated circuit comprises: identifying, based on a static timing analysis, one or more critical paths included in the integrated circuit; performing a noise simulation to generate one or more voltage waveforms at each gate associated with the one or more critical paths; applying the one or more voltage waveforms to one or more netlists corresponding to the one or more critical paths to generate one or more modified netlists; performing a timing analysis on the one or more modified netlists to determine a set of slack times that correspond to a set of voltages applied to the integrated circuit; and determining, based on the set of slack times, a first critical path included in the one or more critical paths that has a lowest slack time relative to all other critical paths included in the one or more critical paths.

2. The computer-implemented method according to clause 1, wherein identifying the one or more critical paths comprises: determining a path delay for each circuit path included in the integrated circuit; determining that a first circuit path included in the integrated circuit has a longer path delay relative to one or more other circuit paths included in the integrated circuit; and designating the first circuit path as a critical path.

3. The computer-implemented method according to clause 1 or clause 2, further comprising extracting, from the design of the integrated circuit, a different netlist for each critical path included in the one or more critical paths.

4. The computer-implemented method according to any of clauses 1-3, wherein performing the timing analysis on the one or more modified netlists comprises: determining that a clock output associated with the integrated circuit operates at a fixed frequency; applying a model of a fixed-frequency clock to the one or more modified netlists; determining a clock cycle duration of a fixed frequency associated with the fixed-frequency clock; and determining a first slack time based on a difference between the clock cycle duration of the fixed frequency and a path delay associated with a first modified netlist.

5. The computer-implemented method according to any of clauses 1-4, wherein determining the first critical path comprises ordering the one or more modified netlists based on the set of slack times to identify a first modified netlist that has a lowest slack time relative to all other modified netlists included in the one or more modified netlists.

6. The computer-implemented method according to any of clauses 1-5, wherein performing the timing analysis on the one or more modified netlists comprises: determining that a clock output associated with the integrated circuit operates at a noise-adaptive frequency; applying a model of a noise-adaptive clock to the one or more modified netlists; determining a clock cycle duration of a first operating frequency associated with the adaptive clock based on a first value of a supply voltage; and determining a first slack time based on a difference between the clock cycle duration of the first operating frequency and a path delay associated with a first modified netlist.

7. The computer-implemented method according to any of clauses 1-6, wherein determining the first critical path comprises ordering the one or more modified netlists based on the set of slack times to identify a first modified netlist that has a lowest slack time relative to all other modified netlists included in the one or more modified netlists.

8. The computer-implemented method according to any of clauses 1-7, further comprising: determining that the supply voltage has changed from the first value to a second value; determining a clock cycle duration of a second operating frequency associated with the adaptive clock based on the second value of a supply voltage; and determining the first slack time based on a difference between the clock cycle duration of the second operating frequency and the path delay associated with the first modified netlist.

9. The computer-implemented method according to any of clauses 1-8, wherein applying the one or more voltage waveforms comprises: identifying one or more gates associated with a first netlist included in the one or more netlists; determining a voltage at each gate based on the one or more voltage waveforms; and annotating the first netlist with the voltage at each gate to generate a first modified netlist.

10. The computer-implemented method according to any of clauses 1-9, wherein the noise simulation comprises a vector-based noise simulation.

11. The computer-implemented method according to any of clauses 1-10, wherein the noise simulation comprises a vector-less noise simulation.

12. In some embodiments, one or more non-transitory computer-readable storage media include instructions that, when executed by one or more processors, cause the one or more processors to perform pre-silicon testing of a design for an integrated circuit by performing the steps of: identifying, based on a static timing analysis, one or more critical paths included in the integrated circuit; generating one or more voltage waveforms at each gate associated with the one or more critical paths; generating one or more modified netlists based on the one or more voltage waveforms and one or more netlists corresponding to the one or more critical paths; performing a timing analysis on the one or more modified netlists to determine a set of slack times that correspond to a set of voltages applied to the integrated circuit; and determining, based on the set of slack times, a first critical path included in the one or more critical paths that has a lowest slack time relative to all other critical paths included in the one or more critical paths.

13. The one or more non-transitory computer-readable storage media according to clause 12, wherein identifying the one or more critical paths comprises: determining a path delay for each circuit path included in the integrated circuit; determining that a first circuit path included in the integrated circuit has a longer path delay relative to one or more other circuit paths included in the integrated circuit; and designating the first circuit path as a critical path.

14. The one or more non-transitory computer-readable storage media according to clause 12 or clause 13, wherein the instructions, when executed by the one or more processors, cause the one or more processors to further perform the step of extracting, from the design of the integrated circuit, a different netlist for each critical path included in the one or more critical paths.

15. The one or more non-transitory computer-readable storage media according to any of clauses 12-14, wherein performing the timing analysis on the one or more modified netlists comprises: determining that a clock output associated with the integrated circuit operates at a fixed frequency; applying a model of a fixed-frequency clock to the one or more modified netlists; determining a clock cycle duration of a fixed frequency associated with the fixed-frequency clock; and determining a first slack time based on a difference between the clock cycle duration of the fixed frequency and a path delay associated with a first modified netlist.

16. The one or more non-transitory computer-readable storage media according to any of clauses 12-15, wherein determining the first critical path comprises ordering the one or more modified netlists based on the set of slack times to identify a first modified netlist that has a lowest slack time relative to all other modified netlists included in the one or more modified netlists.

17. The one or more non-transitory computer-readable storage media according to any of clauses 12-16, wherein the one or more voltage waveforms include at least one of a supply voltage waveform, a ground signal waveform, and an input voltage waveform.

18. The one or more non-transitory computer-readable storage media according to any of clauses 12-17, wherein the instructions, when executed by the one or more processors, cause the one or more processors to further perform the steps of: identifying, based on the static timing analysis, a portion of the one or more critical paths that have a first static slack value; identifying a portion of the one or more modified netlists that correspond with the portion of the one or more critical paths; and ordering the portion of the one or more modified netlists in order of slack time to identify a first modified netlist included in the portion of the one or more modified netlists that has a lower slack time relative to other modified netlists included in the portion of the one or more modified netlists.

19. The one or more non-transitory computer-readable storage media according to any of clauses 12-18, wherein the instructions, when executed by the one or more processors, cause the one or more processors to further perform the steps of: identifying, based on the static timing analysis, a static slack value for a first critical path included in the one or more critical paths; and generating a metric based on a difference between a slack time included in the set of slack times for a first modified path that corresponds to the first critical path and the static slack value.

20. A computing device, comprising: a memory that includes instructions; and a processor that is coupled to the memory and, when executing the instructions, is configured to: identify, based on a static timing analysis, one or more critical paths included in the integrated circuit; perform a noise simulation based on at least one of an a supply voltage and a ground voltage to generate one or more voltage waveforms at each gate associated with the one or more critical paths; apply the one or more voltage waveforms to one or more netlists corresponding to the one or more critical paths to generate one or more modified netlists; perform a timing analysis on the one or more modified netlists to determine a set of slack times that correspond to a set of voltages applied to the integrated circuit; and determine, based on the set of slack times, a first critical path included in the one or more critical paths that has a lowest slack time relative to all other critical paths included in the one or more critical paths.

Any and all combinations of any of the claim elements recited in any of the claims and/or any elements described in this application, in any fashion, fall within the contemplated scope of the present disclosure and protection.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments.

Aspects of the present embodiments may be embodied as a system, method or computer program product. Accordingly, aspects of the present disclosure may take the form of an entirely hardware embodiment, an entirely software embodiment (including firmware, resident software, microcode, etc.) or an embodiment combining software and hardware aspects that may all generally be referred to herein as a "module," a "system," or a "computer." In addition, any hardware and/or software technique, process, function, component, engine, module, or system described in the present disclosure may be implemented as a circuit or set of circuits. Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine. The instructions, when executed via the processor of the computer or other programmable data processing apparatus, enable the implementation of the functions/acts specified in the flowchart and/or block diagram block or blocks. Such processors may be, without limitation, general purpose processors, special-purpose processors, application-specific processors, or field-programmable gate arrays.

The flowchart and block diagrams in the figures illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The disclosure has been described above with reference to specific embodiments. Persons of ordinary skill in the art, however, will understand that various modifications and changes may be made thereto without departing from the broader spirit and scope of the disclosure as set forth in the appended claims. For example, and without limitation, although many of the descriptions herein refer to specific types of application data, content servers, and client devices, persons skilled in the art will appreciate that the systems and techniques described herein are applicable to other types of application data, content servers, and client devices. The foregoing description and drawings are, accordingly, to be regarded in an illustrative rather than a restrictive sense.

While the preceding is directed to embodiments of the present disclosure, other and further embodiments of the disclosure may be devised without departing from the basic scope thereof, and the scope thereof is determined by the claims that follow.

What is claimed is:

1. A computer-implemented method for pre-silicon testing of a design for an integrated circuit, comprising:
    identifying, based on a static timing analysis, one or more critical paths included in the integrated circuit;
    performing a noise simulation to generate one or more voltage waveforms at each gate associated with the one or more critical paths;
    annotating, with the one or more voltage waveforms at each gate, one or more netlists corresponding to the one or more critical paths to generate one or more modified netlists;
    performing a timing analysis on the one or more modified netlists to determine a set of slack times that correspond to a set of voltages applied to the integrated circuit; and
    determining, based on the set of slack times, a first critical path included in the one or more critical paths that has a lowest slack time relative to all other critical paths included in the one or more critical paths.

2. The computer-implemented method of claim 1, wherein identifying the one or more critical paths comprises:
    determining a path delay for each circuit path included in the integrated circuit;
    determining that a first circuit path included in the integrated circuit has a longer path delay relative to one or more other circuit paths included in the integrated circuit; and
    designating the first circuit path as a critical path.

3. The computer-implemented method of claim 1, further comprising extracting, from the design of the integrated circuit, a different netlist for each critical path included in the one or more critical paths.

4. The computer-implemented method of claim 1, wherein performing the timing analysis on the one or more modified netlists comprises:
    determining that a clock output associated with the integrated circuit operates at a fixed frequency;
    applying a model of a fixed-frequency clock to the one or more modified netlists;
    determining a clock cycle duration of a fixed frequency associated with the fixed-frequency clock; and
    determining a first slack time based on a difference between the clock cycle duration of the fixed frequency and a path delay associated with a first modified netlist.

5. The computer-implemented method of claim 1, wherein determining the first critical path comprises ordering the one or more modified netlists based on the set of slack times to identify a first modified netlist that has a lowest slack time relative to all other modified netlists included in the one or more modified netlists.

6. The computer-implemented method of claim 1, wherein performing the timing analysis on the one or more modified netlists comprises:
    determining that a clock output associated with the integrated circuit operates at a noise-adaptive frequency;
    applying a model of a noise-adaptive clock to the one or more modified netlists;
    determining a clock cycle duration of a first operating frequency associated with the adaptive clock based on a first value of a supply voltage; and
    determining a first slack time based on a difference between the clock cycle duration of the first operating frequency and a path delay associated with a first modified netlist.

7. The computer-implemented method of claim 6, wherein determining the first critical path comprises ordering the one or more modified netlists based on the set of slack times to identify a first modified netlist that has a lowest slack time relative to all other modified netlists included in the one or more modified netlists.

8. The computer-implemented method of claim 6, further comprising:
   determining that the supply voltage has changed from the first value to a second value;
   determining a clock cycle duration of a second operating frequency associated with the adaptive clock based on the second value of a supply voltage; and
   determining the first slack time based on a difference between the clock cycle duration of the second operating frequency and the path delay associated with the first modified netlist.

9. The computer-implemented method of claim 1, wherein annotating, with the one or more voltage waveforms at each gate, comprises:
   identifying one or more gates associated with a first netlist included in the one or more netlists;
   determining a voltage at each of the one or more gates based on the one or more voltage waveforms; and
   annotating the first netlist with the voltage at each gate to generate a first modified netlist.

10. The computer-implemented method of claim 1, wherein the noise simulation comprises a vector-based noise simulation.

11. The computer-implemented method of claim 1, wherein the noise simulation comprises a vector-less noise simulation.

12. One or more non-transitory computer-readable storage media including instructions that, when executed by one or more processors, cause the one or more processors to perform pre-silicon testing of a design for an integrated circuit by performing steps of:
   identifying, based on a static timing analysis, one or more critical paths included in the integrated circuit;
   generating one or more voltage waveforms at each gate associated with the one or more critical paths;
   generating one or more modified netlists by annotating, with the one or more voltage waveforms at each gate, one or more netlists corresponding to the one or more critical paths;
   performing a timing analysis on the one or more modified netlists to determine a set of slack times that correspond to a set of voltages applied to the integrated circuit; and
   determining, based on the set of slack times, a first critical path included in the one or more critical paths that has a lowest slack time relative to all other critical paths included in the one or more critical paths.

13. The one or more non-transitory computer-readable storage media of claim 12, wherein identifying the one or more critical paths comprises:
   determining a path delay for each circuit path included in the integrated circuit;
   determining that a first circuit path included in the integrated circuit has a longer path delay relative to one or more other circuit paths included in the integrated circuit; and
   designating the first circuit path as a critical path.

14. The one or more non-transitory computer-readable storage media of claim 12, wherein the instructions, when executed by the one or more processors, cause the one or more processors to further perform the step of extracting, from the design of the integrated circuit, a different netlist for each critical path included in the one or more critical paths.

15. The one or more non-transitory computer-readable storage media of claim 12, wherein performing the timing analysis on the one or more modified netlists comprises:
   determining that a clock output associated with the integrated circuit operates at a fixed frequency;
   applying a model of a fixed-frequency clock to the one or more modified netlists;
   determining a clock cycle duration of a fixed frequency associated with the fixed-frequency clock; and
   determining a first slack time based on a difference between the clock cycle duration of the fixed frequency and a path delay associated with a first modified netlist.

16. The one or more non-transitory computer-readable storage media of claim 12, wherein determining the first critical path comprises ordering the one or more modified netlists based on the set of slack times to identify a first modified netlist that has a lowest slack time relative to all other modified netlists included in the one or more modified netlists.

17. The one or more non-transitory computer-readable storage media of claim 12, wherein the one or more voltage waveforms include at least one of a supply voltage waveform, a ground signal waveform, or an input voltage waveform.

18. The one or more non-transitory computer-readable storage media of claim 12, wherein the instructions, when executed by the one or more processors, cause the one or more processors to further perform the steps of:
   identifying, based on the static timing analysis, a portion of the one or more critical paths that have a first static slack value;
   identifying a portion of the one or more modified netlists that correspond with the portion of the one or more critical paths; and
   ordering the portion of the one or more modified netlists in order of slack time to identify a first modified netlist included in the portion of the one or more modified netlists that has a lower slack time relative to other modified netlists included in the portion of the one or more modified netlists.

19. The one or more non-transitory computer-readable storage media of claim 12, wherein the instructions, when executed by the one or more processors, cause the one or more processors to further perform the steps of:
   identifying, based on the static timing analysis, a static slack value for a first critical path included in the one or more critical paths; and
   generating a metric based on a difference between a slack time included in the set of slack times for a first modified path that corresponds to the first critical path and the static slack value.

20. A computing device, comprising:
   a memory that includes instructions; and
   a processor that is coupled to the memory and, when executing the instructions, is configured to:
      identify, based on a static timing analysis, one or more critical paths included in an integrated circuit;
      perform a noise simulation based on at least one of a supply voltage or a ground voltage to generate one or more voltage waveforms at each gate associated with the one or more critical paths;
      annotate, with the one or more voltage waveforms at each gate, one or more netlists corresponding to the one or more critical paths to generate one or more modified netlists;
      perform a timing analysis on the one or more modified netlists to determine a set of slack times that correspond to a set of voltages applied to the integrated circuit; and determine, based on the set of slack times, a first critical path included in the one or more critical paths that has a lowest slack time relative to all other critical paths included in the one or more critical paths.

* * * * *